(12) United States Patent
Scobey et al.

(10) Patent No.: US 11,932,932 B2
(45) Date of Patent: *Mar. 19, 2024

(54) SPUTTERING SYSTEM WITH A PLURALITY OF CATHODE ASSEMBLIES

(71) Applicant: Alluxa, Inc., Santa Rosa, CA (US)

(72) Inventors: Michael A. Scobey, Santa Rosa, CA (US); Shaun Frank McCaffery, Healdsburg, CA (US)

(73) Assignee: Alluxa, Inc., Santa Rosa, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/048,957

(22) Filed: Oct. 24, 2022

(65) Prior Publication Data

US 2023/0133160 A1    May 4, 2023

Related U.S. Application Data

(63) Continuation of application No. 17/070,049, filed on Oct. 14, 2020, now Pat. No. 11,479,847.

(51) Int. Cl.
*C23C 14/35* (2006.01)
*H01J 37/32* (2006.01)
(Continued)

(52) U.S. Cl.
CPC ............ *C23C 14/351* (2013.01); *C23C 14/34* (2013.01); *C23C 14/3464* (2013.01);
(Continued)

(58) Field of Classification Search
None
See application file for complete search history.

(56) References Cited

U.S. PATENT DOCUMENTS

| 4,166,018 A | 8/1979 | Chapin |
| 4,444,643 A | 4/1984 | Garrett |
| (Continued) | | |

FOREIGN PATENT DOCUMENTS

| DE | 102013221029 A1 | 4/2015 |
| JP | S59085864 A | 5/1984 |
| (Continued) | | |

OTHER PUBLICATIONS

Jan. 28, 2022 (WO) International Search Report PCT/US2021/054992.

(Continued)

*Primary Examiner* — Jason Berman
(74) *Attorney, Agent, or Firm* — Banner & Witcoff, Ltd.

(57) ABSTRACT

A magnetron sputtering system includes a substrate mounted within a vacuum chamber. A plurality of cathode assemblies includes a first set of cathode assemblies and a second set of cathode assemblies, and is configured for reactive sputtering. Each cathode assembly includes a target comprising sputterable material and has an at least partially exposed planar sputtering surface. A target support is configured to support the target in the vacuum chamber and rotate the target relative to the vacuum chamber about a target axis. A magnetic field source includes a magnet array. A cathode assemblies controller assembly is operative to actuate the first set of cathode assemblies without actuating the second set of cathode assemblies, and to actuate the second set of cathode assemblies without actuating the first set of cathode assemblies.

20 Claims, 14 Drawing Sheets

(51) Int. Cl.
*H01J 37/34* (2006.01)
*C23C 14/34* (2006.01)

(52) U.S. Cl.
CPC .... *C23C 14/3492* (2013.01); *H01J 37/32669* (2013.01); *H01J 37/345* (2013.01); *H01J 37/3417* (2013.01); *H01J 37/3444* (2013.01); *H01J 37/3464* (2013.01)

(56) References Cited

U.S. PATENT DOCUMENTS

| | | |
|---|---|---|
| 4,995,958 A | 2/1991 | Anderson et al. |
| 5,248,402 A | 9/1993 | Ballentine et al. |
| 5,525,199 A | 6/1996 | Scobey |
| 5,770,025 A | 6/1998 | Kiyota |
| 5,830,327 A | 11/1998 | Kolenkow |
| 6,238,531 B1 * | 5/2001 | Pinarbasi ............. G11B 5/3903 204/192.15 |
| 6,258,217 B1 | 7/2001 | Richards et al. |
| 7,156,961 B2 | 1/2007 | Okatani et al. |
| 8,052,850 B2 | 11/2011 | Lim et al. |
| 9,771,647 B1 | 9/2017 | Scobey et al. |
| 2002/0139666 A1 | 10/2002 | Hsueh et al. |
| 2003/0116432 A1 | 6/2003 | Schweitzer et al. |
| 2004/0089535 A1 | 5/2004 | Wolfe et al. |
| 2005/0139467 A1 | 6/2005 | Takahashi |
| 2005/0178660 A1 | 8/2005 | Lopp et al. |
| 2005/0252767 A1 | 11/2005 | Takahashi |
| 2006/0076232 A1 | 4/2006 | Miller et al. |
| 2010/0236918 A1 | 9/2010 | Imakita et al. |
| 2017/0053784 A1 * | 2/2017 | Subramani .......... H01J 37/3441 |

FOREIGN PATENT DOCUMENTS

| | | |
|---|---|---|
| JP | H02101158 A | 4/1990 |
| JP | 403-006371 A | 1/1991 |
| JP | 2001035846 A | 2/2001 |

OTHER PUBLICATIONS

Jan. 28, 2022 (WO) Written Opinion of the International Search Authority PCT/US2021/054992.

* cited by examiner

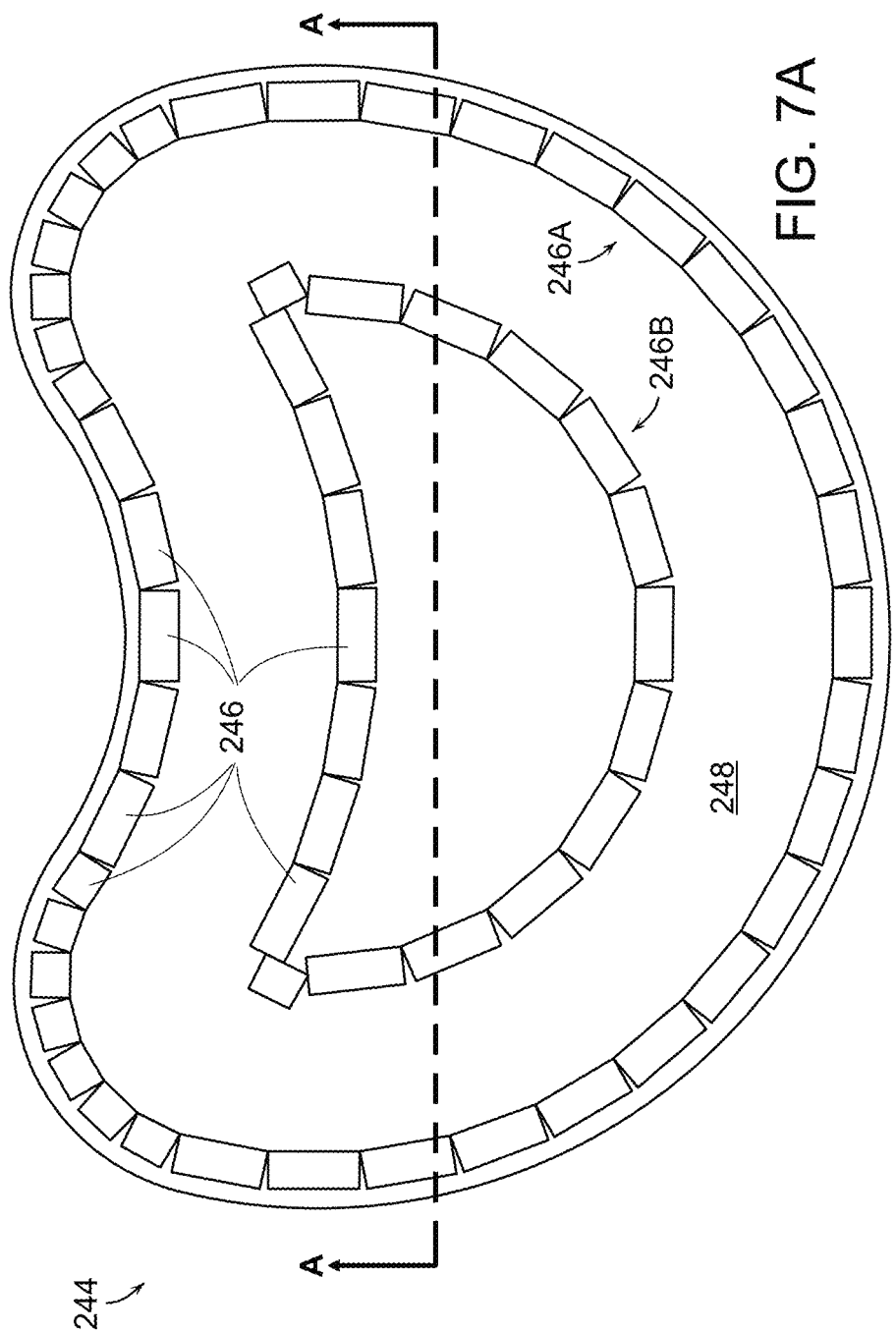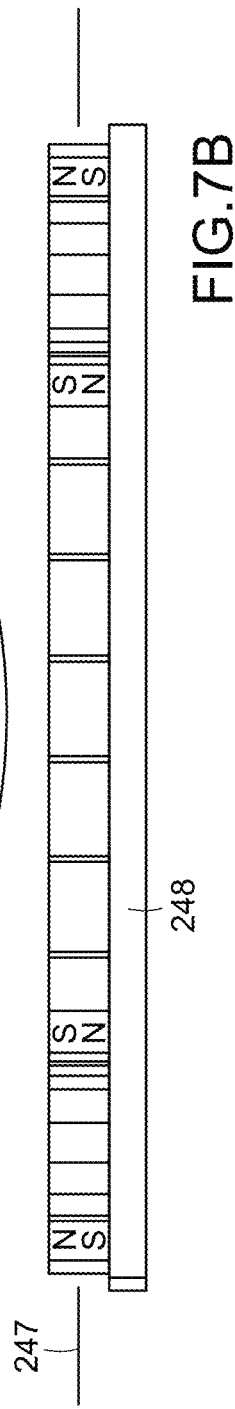

SPUTTERING SYSTEM WITH A PLURALITY OF CATHODE ASSEMBLIES

RELATED APPLICATION DATA

This application is a continuation application which claims priority to U.S. patent application Ser. No. 17/070, 049, filed on Oct. 14, 2020, issuing as U.S. Pat. No. 11,479,847, which is hereby incorporated by reference in its entirety.

FIELD OF THE INVENTION

The inventive subject matter disclosed herein involves a cathode assembly for a sputtering system, and in particular, a cathode assembly having a movable target. The inventive subject matter further involves sputtering systems including a plurality of cathode assemblies with movable targets that may be operated in alternating fashion.

BACKGROUND

A sputtering process deposits a thin film of target material on a substrate by dislodging small particles or atoms from a target, which coat the substrate. Magnetic fields have been used to enhance the sputtering process. For example, as disclosed in U.S. Pat. No. 4,166,018 to Chapin, titled "Sputtering Process and Apparatus," which is incorporated herein by reference in its entirety, in a conventional vacuum sputtering process a substrate is placed in front of a sputtering cathode in a vacuum chamber. The sputtering cathode includes a substantially planar target formed of the target material. The pressure in the chamber is reduced and then, optionally, back filled with a reactive or inert sputtering gas or a combination of the two. A negative voltage is applied to produce a plasma discharge at the target surface. The plasma discharge is intensified by magnets located behind the target to produce a closed loop magnetic field over the target surface.

Over time, the target becomes depleted. Unfortunately, uneven depletion of the target, e.g., grooving of the target surface, can adversely impact the quality of the film deposited on the substrate as well as change the uniformity of the film. It can also result in inefficient use of the target, with consequent cost penalties. One cause of uneven depletion of the target surface is that erosion is highest at regions where the magnetic field lines are tangent to the target surface. Thus, it is known in the art to rotate an array of magnets behind the target, to develop more uniform erosion of the target surface. U.S. Pat. No. 4,995,958 to Anderson et al., titled "Sputtering Apparatus with a Rotating Magnet Array having a Geometry for Specified Target Erosion Profile," U.S. Pat. No. 5,248,402 to Ballentine et al., titled "Apple-Shaped Magnetron for Sputtering System," U.S. Pat. No. 5,830,327 to Kolenkow, titled "Methods and Apparatus for Sputtering with Rotating Magnet Sputter Sources," and U.S. Pat. No. 6,258,217 to Richards et al., titled "Rotating Magnet Array and Sputter Source," each of which is incorporated herein by reference in its entirety, disclose various cathode assemblies for sputtering systems having a magnet array that rotates behind the plane of a circular flat target. It is also known to optimize the shape of the magnet array, either symmetric or asymmetric with respect to the axis of rotation, to further reduce uneven erosion of target surface.

A DC magnetron sputtering device with a plurality of cathode assemblies is disclosed in U.S. Pat. No. 9,771,647, titled "Cathode Assemblies and Sputtering Systems", which is incorporated herein by reference in its entirety.

Rotating magnet arrays create a moving deposition erosion zone at the stationary surface of the target and, correspondingly, a moving deposition plume from the surface of the target. This may result in an uneven deposition pattern on the substrate and a reduced ability to deposit precision films. This may be particularly problematic for certain sputtering processes, such as long-throw sputtering or long-throw reactive sputtering.

Further, the areas on the target that are not being eroded are subject to back coating and reactive gas poisoning. This can result in arcing and/or a reduced deposition rate. With moving magnets, it becomes problematic to cover areas of the target that are not getting eroded with shields that could prevent back-scattered coating material or reactive gases from building up a layer of undesirable material on the target surface. Typically, with moving magnets, the bigger the ratio of the target area to the magnet area, the worse these problems can become.

There is a need in the sputtering art to reduce non-uniform erosion of the target and provide improved target utilization. There is a further need to provide improved deposition rates and improved uniformity of the deposited films when depositing onto large-area substrates.

SUMMARY

In accordance with one aspect, a magnetron sputtering system, e.g., a reactive sputtering system, includes vacuum chamber and a substrate mount for mounting a substrate within the vacuum chamber. A plurality of cathode assemblies in the vacuum chamber includes a first set of one or more cathode assemblies and at least one other set of one or more cathode assemblies, e.g., a second set of one or more cathode assemblies. The plurality of cathode assemblies is configured for sputtering, e.g., reactive sputtering. Each cathode assembly includes a target comprising sputterable material with an at least partially exposed planar sputtering surface. A target support is configured to support the target in the vacuum chamber and rotate the target relative to the vacuum chamber about a target axis. The cathode assemblies each further comprises a magnetic field source, including a magnet array. The plurality of cathode assemblies is configured such that when the first set of cathode assemblies is operating the second set of cathode assemblies is not operating, and when the second set of cathode assemblies is operating the first set of cathode assemblies is not operating. A cathode assemblies controller assembly is operative to actuate the first set of cathode assemblies for sputtering the sputterable material of the first set of cathode assemblies without actuating the second set of cathode assemblies, and to actuate the second set of cathode assemblies for sputtering the sputterable material of the second set of cathode assemblies without actuating the first set of cathode assemblies. It should be understood that in at least certain embodiments of the inventive technology disclosed here, all or at least some of the cathode assemblies can be switched from one of the sets of cathode assemblies to a different set of the cathode assemblies by the cathode assemblies controller.

In accordance with further aspects, a magnetron sputtering system, e.g., a reactive sputtering system, includes a vacuum chamber and a substrate mount for mounting a substrate rotatably about a central axis within the vacuum chamber. A plurality of cathode assemblies is arranged in a confocal orientation about the central axis, including a first set of one or more cathode assemblies and a second set of one or more cathode assemblies, and is configured for sputtering, e.g., reactive sputtering. Each cathode assembly includes a target comprising sputterable material having an at least partially exposed planar sputtering surface, a target support configured to support the target in the vacuum chamber and rotate the target relative to the vacuum chamber about a target axis, and a magnetic field source including a magnet array. The plurality of cathode assemblies is configured such that when the first set of cathode assemblies is operational the second set of cathode assemblies is idle, and when the second set of cathode assemblies is operational the first set of cathode assemblies is idle. In at least certain embodiments of this disclosure, all or at least some of the cathode assemblies can be switched back and forth between the different sets of cathode assemblies by the cathode assemblies controller.

In accordance with other aspects, a magnetron sputtering system includes a vacuum chamber and a substrate rotatably mounted about a central axis within the vacuum chamber and configured to rotate at a suitable speed, for example, a speed of between approximately 30 rpm and approximately 1500 rpm. A plurality of cathode assemblies is arranged in a confocal orientation about the central axis, and includes a first set of two cathode assemblies and a second set of two cathode assemblies, and is configured for sputtering, e.g., reactive sputtering. Each cathode assembly includes a target comprising sputterable material having an at least partially exposed sputtering surface. A target support is configured to support the target in the vacuum chamber and rotate the target relative to the vacuum chamber about a target axis, with each target axis being oriented with respect to the central axis at an angle of greater than 0 degrees and less than 90 degrees. The cathode assemblies each further comprises a magnetic field source including a magnet array. A cathode assemblies controller comprises a timer to control operation of the first set of cathode assemblies and the second set of cathode assemblies, such that when the first set of cathode assemblies is operational (i.e., is sputtering target material to deposit onto the substrate) the second set of cathode assemblies is idle, and when the second set of cathode assemblies is operational the first set of cathode assemblies is idle.

In at least certain exemplary embodiments, the magnetic field source comprises a magnet array. In certain exemplary embodiments, such magnet array is behind the target, i.e., on the side of the target opposite the erosion or sputtering surface (those terms being used interchangeably here and in the appended claims), e.g., opposite the side that will face the substrate to be coated during use of the cathode assembly in a sputtering operation. The magnet array may, for example, be a two-dimensional array in a plane generally parallel to the planar erosion surface or planar sputtering surface of the target. Optionally, the cathode assembly also has a magnet array support configured to support the magnet array, e.g., in a stationary position during movement of the target in a vacuum chamber during sputtering. In certain exemplary embodiments the target support of the cathode assembly comprises a frame. Optionally, in embodiments having a magnet array and such frame, the magnet array may be supported within the frame behind the target. Optionally, the target may be water cooled.

In certain exemplary embodiments the cathode assembly further comprises a mounting surface for fixed-position mounting to a vacuum chamber to position the cathode assembly at least partially within the vacuum chamber. The target support of the cathode assemblies disclosed here typically are operative to move the target relative to the mounting surface during sputtering. In certain exemplary embodiments the planar sputtering surface of the target is circular and the target support is operative to rotate the target in a vacuum chamber during sputtering, that is, to spin the target on an axis not parallel to, e.g., generally perpendicular to, the target's planar sputtering surface. In certain exemplary embodiments the target support is operative to orbit and rotate the target in a vacuum chamber during sputtering, wherein the orbiting and rotating are in generally the same plane. It should be understood that use of the term "generally" and similar terms here and in the appended claims is intended to mean approximately or within the constraints of sensible, commercial engineering objectives, costs and capabilities. In other exemplary embodiments the target support is operative to move the target back and forth in the plane of the planar sputtering surface in a vacuum chamber during sputtering. In some embodiments the target support is operative to provide compound movement of the target, e.g., a combination of lateral and spinning movement, etc. In certain exemplary embodiments the cathode assembly is operative to dither the magnet assembly during sputtering.

In accordance with another aspect, a cathode assembly for a sputtering system includes a target support configured to support a target having a planar erosion surface. The target may define a target axis that is substantially perpendicular to the planar erosion surface of the target. The target support is configured to rotate the target around the target axis. The cathode assembly may further include a magnetic field source, wherein the target support is configured to move the target relative to the magnetic field source.

In accordance with another aspect, a cathode assembly for a sputtering system includes a target support configured to support a target having an erosion surface and a magnetic field source. The target support is configured to rotate the target around an axis that is not parallel to the erosion surface of the target. The target support is further configured to move the target relative to the magnetic field source.

In accordance with another aspect, a cathode assembly for a sputtering system has a target support and a magnet array that includes a plurality of magnets arranged in a substantially two-dimensional planar array and defining a substantially two-dimensional magnet plane. The target support is configured to move a substantially planar target in a plane substantially parallel to the substantially two-dimensional magnet plane.

Additionally, another aspect of the present invention is directed to magnetron sputtering systems comprising a vacuum chamber, a cathode assembly in accordance with the disclosure above, mounted to the vacuum chamber, and a magnetic field source for the erosion surface. At least certain exemplary embodiments of the magnetron sputtering systems disclosed here include a vacuum chamber having a mount for a workpiece, i.e., a substrate to be coated, a cathode assembly comprising a target of sputterable material having an at least partially exposed planar sputtering surface and a target support configured to support and move the target in the vacuum chamber during sputtering, and a magnetic field source. The target support is configured to move the target relative to the chamber, and typically relative to the magnetic field produced by the magnetic field source. The target support in certain exemplary embodiments is configured to rotate the target around an axis that is not parallel to the erosion surface of the target, e.g., perpendicular to that surface. The magnetic field source may include a plurality of magnets arranged in a substantially two-dimensional array.

In at least certain exemplary embodiments of the magnetron sputtering systems disclosed here, an energy source or power source (e.g. RF, DC, pulsed DC, dual alternating cathode DC) is provided to maintain the sputtering plasma during sputtering, typically during operation of the magnetron sputtering system for deposition of material from a target onto a substrate in a vacuum chamber. It will be understood by those skilled in the art, given the benefit of this disclosure, that the magnetron sputtering systems typically will be used in a vacuum chamber. It can be mounted entirely inside or through the wall of a vacuum chamber. Typically, feedthroughs can be used to deliver power, cooling water, etc. to the magnetron sputtering systems or otherwise into the chamber. In certain exemplary embodiments cooling liquid is used for cooling the target. For example, cooling liquid lines can be used to circulate water or other cooling liquid to cool the target. In certain exemplary embodiments cooling liquid is circulated to a thermally conductive backing plate for the target, e.g., a metal plate in thermal contact with the target. Couplings along such cooling line(s) must be liquid-tight and accommodate the sliding and/or spinning movement of the target. In certain exemplary embodiments of the magnetron sputtering systems disclosed here, a power source is provided to actuate the drive mechanism to move the substantially planar sputtering surface of the target during sputtering.

Another aspect of the present invention is directed to a method for sputtering. In accordance with this aspect, magnetron sputtering methods are provided for deposition of target material on a substrate. The magnetron sputtering methods according to this aspect comprise providing a vacuum chamber with a workpiece mount for mounting a substrate within the chamber during sputtering. A cathode assembly according to the disclosure above is mounted to the vacuum chamber. A workpiece or substrate is mounted in the chamber via the workpiece mount. To sputter target material to deposit onto the substrate, the vacuum chamber is placed under vacuum, for example, at a pressure of approximately $10^{-6}$ Torr. Then, a sputtering gas, e.g. a working gas, typically a noble gas such as argon, and in some cases a reactive gas, such as oxygen or nitrogen is fed into the vacuum chamber. Power is supplied to the cathode assembly to initiate and maintain a sputtering plasma and to move the substantially planar sputtering surface of the target during sputtering. In certain exemplary embodiments the cathode assembly comprises a drive mechanism to rotate the sputtering surface, typically in the plane of the sputtering surface, e.g., about an axis that is perpendicular to the substantially planar surface of the target. In certain exemplary embodiments the drive mechanism moves the substantially planar sputtering surface of the target relative to the magnet array, which may be stationary, i.e., stationary relative to the chamber, the sputtering plume, the substrate (ignoring any spinning motion of the substrate), the workpiece mount and the like. Optionally, in addition to motion of the target's sputtering surface, the magnetic field may be in motion during sputtering, e.g., by oscillating a magnet array proving all or some of the magnetic field. The sputtering may in certain exemplary embodiments be long-throw sputtering of target material onto the substrate.

The sputtering methods disclosed here in accordance with certain exemplary embodiments include providing a cathode assembly having a magnet array and a movable target support connectable to a drive mechanism. The magnet array optionally includes a plurality of magnets arranged in a substantially planar two-dimensional array. Such methods further include providing a substrate, providing a sputtering gas, and supplying power to the cathode assembly. The movable target support is driven to move the substantially planar surface of the target relative to the substantially planar two-dimensional array of the plurality of magnets.

Those of ordinary skill in the art will recognize that the cathode assemblies and sputtering systems and methods disclosed here present significant technical and commercial advantages. Likewise, those of ordinary skill in the art will recognize that innumerable modifications can be made and other features are aspect added without departing from the principles disclosed here.

BRIEF DESCRIPTION OF THE DRAWINGS

The foregoing Summary, as well as the following Detailed Description, will be better understood when read in conjunction with the accompanying drawings.

FIG. 7A is a plan view of a non-round, specifically an apple-shaped or cardioid magnet array (that is, comprising magnets laid out in a cardioid pattern in a plane parallel to the planar sputtering surface of the target) suitable for at least certain exemplary embodiments of the cathode assemblies and sputtering systems disclosed here.

FIG. 7B is a sectional elevation taken through line A-A of FIG. 7A.

Figure 1:
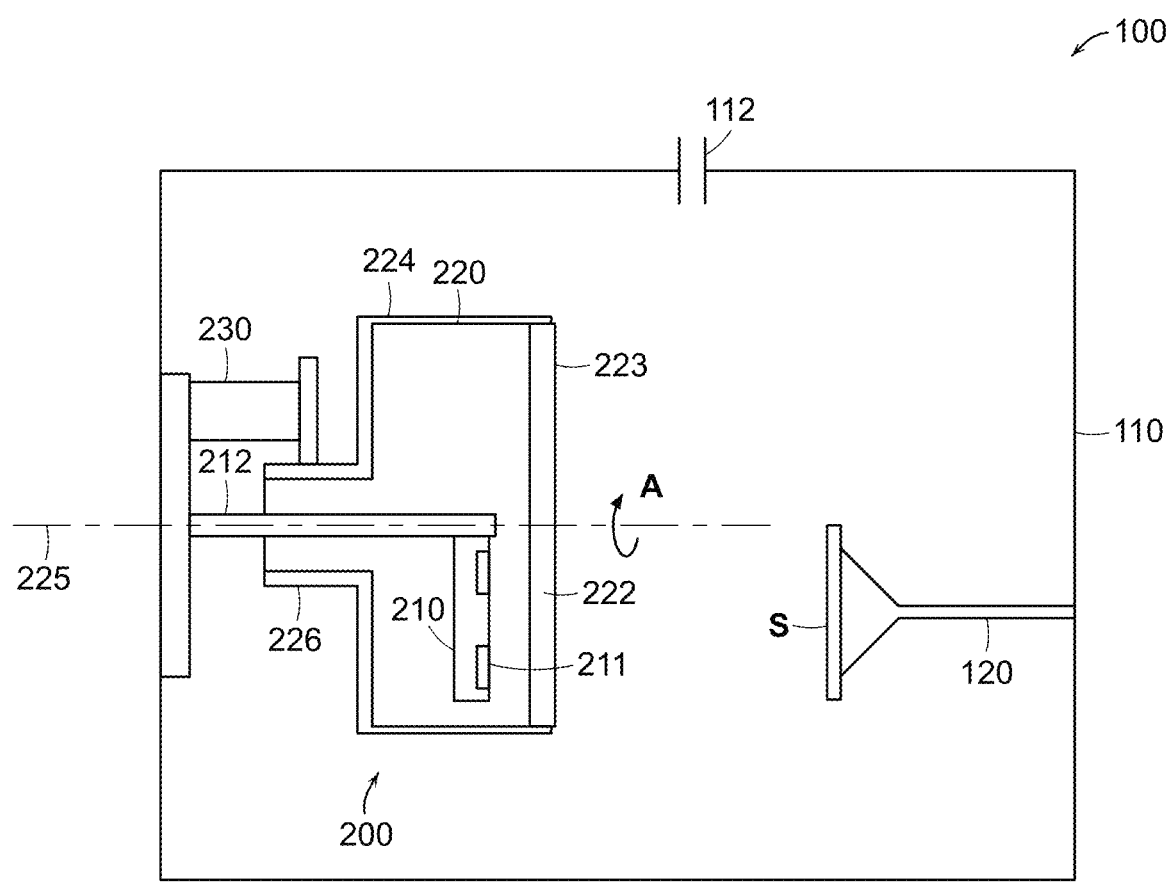
FIG. 1 is a schematic illustration of a sputtering system in accordance with certain exemplary embodiments of the present disclosure.

The figures referred to above are not drawn necessarily to scale, should be understood to provide a representation of particular aspects of the invention, and may be merely conceptual in nature and illustrative of the principles involved. Some features of the cathode assembly and sputtering system depicted in the drawings have been enlarged or distorted relative to others to facilitate explanation and understanding. The same reference numbers are used in the drawings for similar or identical components and features shown in various alternative aspects. Cathode assemblies and sputtering systems as disclosed herein would have configurations and components determined, in part, by the intended application and environment in which they are used.

DETAILED DESCRIPTION OF CERTAIN EXEMPLARY EMBODIMENTS

The basic sputtering processes are well understood for depositing target materials on substrates. The teachings presented herein with respect to cathode assemblies, magnetron sputtering systems and methods may be applied to any sputtering process and apparatus that uses magnetic fields to enhance the sputter deposition process. Further it should be understood the present disclosure contemplates that all disclosed details, including optional and alternative features and details and the like, may be used all together, in any subset, and in any operative combination or permutation.

Reference here to the disclosed cathode assemblies of the magnetron sputtering systems being mounted to or on or in a vacuum chamber should be understood to mean mounting on (i.e., wholly or partially on) the chamber, in (i.e., wholly or partially in) the chamber, to the chamber, within (i.e., wholly or partially within) the chamber, and/or the like. Thus, with the cathode assembly mounted to a vacuum chamber, certain components or portions of components or parts of the cathode assembly may be wholly or partly inside the chamber, some may extend through the wall of the chamber, some may be wholly or partly outside the chamber, etc. As disclosed above, the disclosed cathode assemblies in at least certain exemplary embodiments have a mounting surface for fixed-position mounting to a vacuum chamber. As used here, the term "fixed-position mounting to a vacuum chamber" means that, when a cathode assembly according to such embodiments are mounted to a chamber, the mounting surface of the cathode assembly is fixed or immovable relative to the main body of the chamber, e.g., relative to a chamber wall to which it is bolted or otherwise secured. As a non-limiting example, if the cathode assembly is mounted at a hole or port in the outer wall of a vacuum chamber, the mounting surface may be in fixed, surface-to-surface contact with the inner and/or outer surface of the chamber wall. Certain exemplary embodiments of the cathode assemblies disclosed here will have more than one mounting surface and optionally more than one mounting surface with fixed-position mounting to a vacuum chamber.

In typical operations employing a magnetron sputtering system comprising a cathode assembly in accordance with the present disclosure mounted to a vacuum chamber, the cathode assembly is at least partially within the vacuum chamber. The target in a typical sputtering operation will be within the vacuum chamber or in communication with the main portion of the chamber holding the substrate and, as disclosed above, will be supported for rotation or other movement during sputtering. In those embodiments having a mounting surface as discussed immediately above, the target support is operative to move the target relative to such mounting surface. In that regard, it should be understood that reference here to the target being moveably supported by the target support, and similar descriptions, such as that the target support is operative to move the target, mean that the target support is operative to move the target during sputtering, i.e., during use of the magnetron sputtering system in a sputtering operation, typically in a vacuum chamber. That is, the target support is operative to move the target relative to the plasma plume that will be created by operation of the magnetron sputtering system during sputtering, or relative to the wall(s) of the chamber, or relative to the main body of the chamber or to the main structure or superstructure of the cathode assembly, or to all of them. In typical embodiments, the superstructure of the cathode assembly is mounted to a chamber wall in fixed position to the chamber, and the target support is operative to move the target relative to the plasma plume, chamber and superstructure of the cathode assembly.

The term "approximately" as used herein is meant to mean close to, or about, a particular value, within the constraints of sensible commercial engineering objectives, costs, manufacturing tolerances, and capabilities in the field of sputtering systems and cathode assembly manufacturing and use. Similarly, the term "substantially" as used herein is meant to mean mostly, or almost the same as, within the constraints of sensible commercial engineering objectives, costs, manufacturing tolerances, and capabilities in the field of sputtering systems and cathode assembly manufacturing and use.

Referring now to the drawings, FIG. 1 is a schematic view of sputtering system 100 according to one non-limiting embodiment of the invention. Sputtering system 100 includes a vacuum chamber 110 having a sputtering gas inlet 112, a work piece holder 120 and a cathode assembly 200. Cathode assembly 200 and work piece holder 120 are located within vacuum chamber 110. A substrate (S) is mounted to work piece holder 120. Typically, a sputtering system also includes a vacuum pump, a power source, and one or more sputtering gas sources (not shown).

Figure 2:
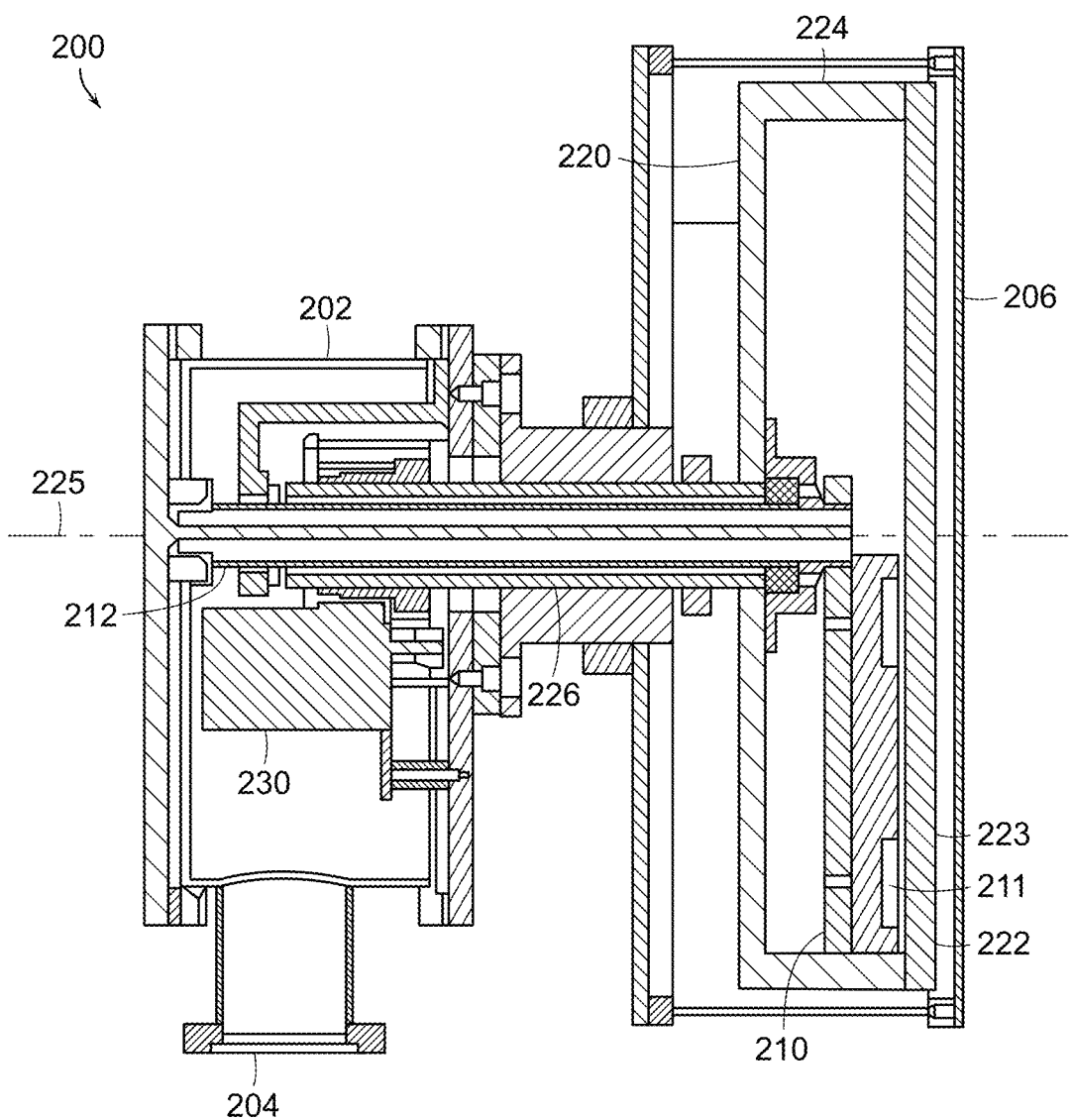
FIG. 2 is a cross-sectional side view of a cathode assembly in accordance with an exemplary embodiment of the present disclosure.
Figure 3:
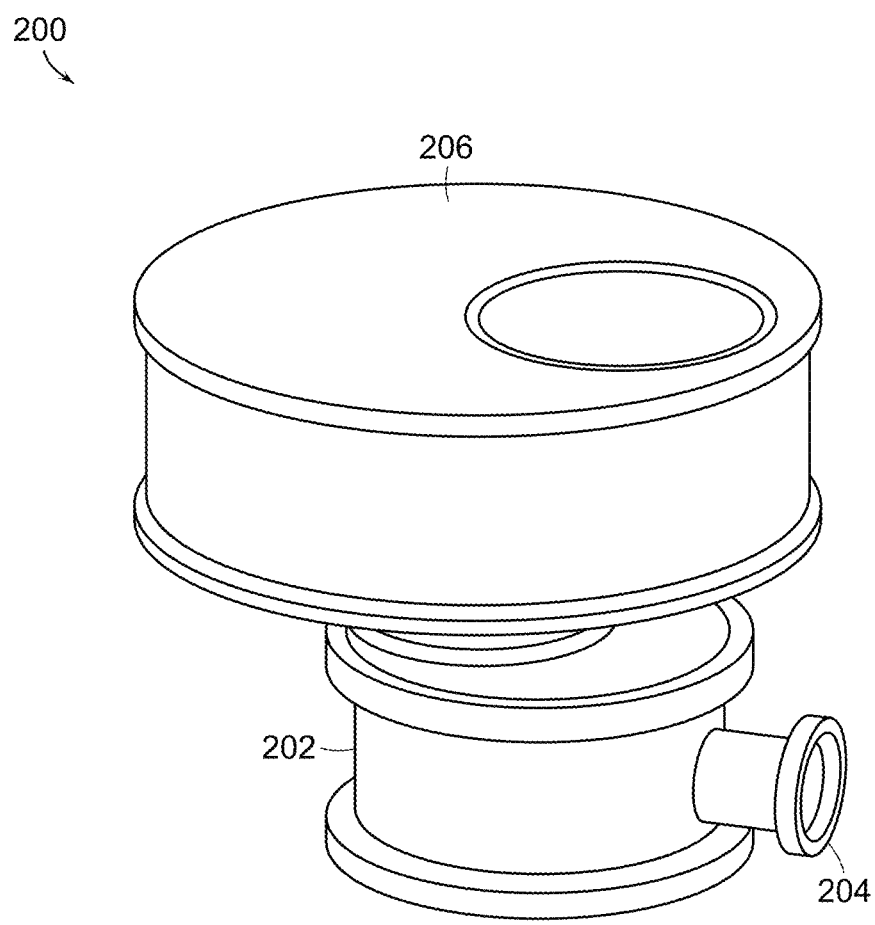
FIG. 3 is an external perspective view of a cathode assembly in accordance with the exemplary embodiment of FIG. 2.

FIG. 2 is a cross-section side view of cathode assembly 200 according to certain aspects of the invention. Cathode assembly 200 includes a magnetic field source, such as magnetic array unit 210, and a target support 220. Referring also to FIG. 3, cathode assembly 200 typically includes a housing 202, a means for cooling the cathode assembly 204 and a dark space shield 206.

As presented in FIGS. 1 and 2, target support 220 holds target 222 within a frame 224. Target 222, which may be formed of one or more target materials, is a substantially planar target having a planar top surface 223. Top surface 223 is an erosion surface that supplies the material to be deposited on substrate (S). The target material that is sputtered may comprise any suitable material as would be apparent to those of ordinary skill in the art. Target 222 may be bonded or otherwise attached to a target backing plate. Reference here to the sputtering or erosion surface of the target being planar or the like means that it is generally flat or lying in a plane. In that regard, it will be understood by those of ordinary skill in the art given the benefit of this disclosure, that the sputtering surface will, of course, not be removed perfectly evenly during sputtering and, so will develop an erosion pattern during sputtering. The sputtering surface should be understood to be planar, as that term is used here (alternatively referred to here and in the claims, either before or after such erosion pattern develops, as being generally planar), notwithstanding such erosion pattern. Target support 220 further includes a hollow shaft 226 extending between frame 224 and drive mechanism 230.

Magnetic array unit 210 can be any suitable source of magnetic field lines as would be apparent to a person of ordinary skill in the art, given the benefit of the present disclosure. According to certain exemplary embodiments of the present invention, magnetic array unit 210 includes one or more permanent magnets 211 arranged in a substantially two-dimensional array. A substantially two-dimensional array of magnets includes a plurality of magnets extending in a first direction and a plurality of magnets extending in a second direction. The array is substantially two-dimensional even if some of the magnets do not lie precisely in the plane. Further, the first and second directions may be linear or curvilinear. When the first and second directions are both linear, the two-dimensional array is planar. When at least one of the first and second directions is curvilinear, the two-dimensional array is no longer planar, but curves out of the plane. As shown in the embodiment of FIG. 2, the substantially two-dimensional array is planar, i.e. the magnets lie substantially in a flat plane. Further, the substantially two-dimensional planar array lies parallel to top surface 223 of target 222. A central shaft 212 supports magnetic array unit 210. Magnetic array designs are known within the industry, and typically use high strength magnets, which are commercially available and commonly known.

According to certain exemplary embodiments of the invention, as shown in FIGS. 1 and 2, magnetic array unit 210 is stationary relative to vacuum chamber 110 during deposition and target support 220 is movable relative to vacuum chamber 110 during deposition. A drive mechanism 230 is drivably connected to target support 220. In operation of such embodiments, drive mechanism 230 causes shaft 226, frame 224 and target 222 to rotate around a target axis 225 (see arrow A in FIG. 1). Target axis 225 is substantially perpendicular to the plane of planar top surface 223. In certain embodiments, target 222 may be water cooled.

Figure 4:
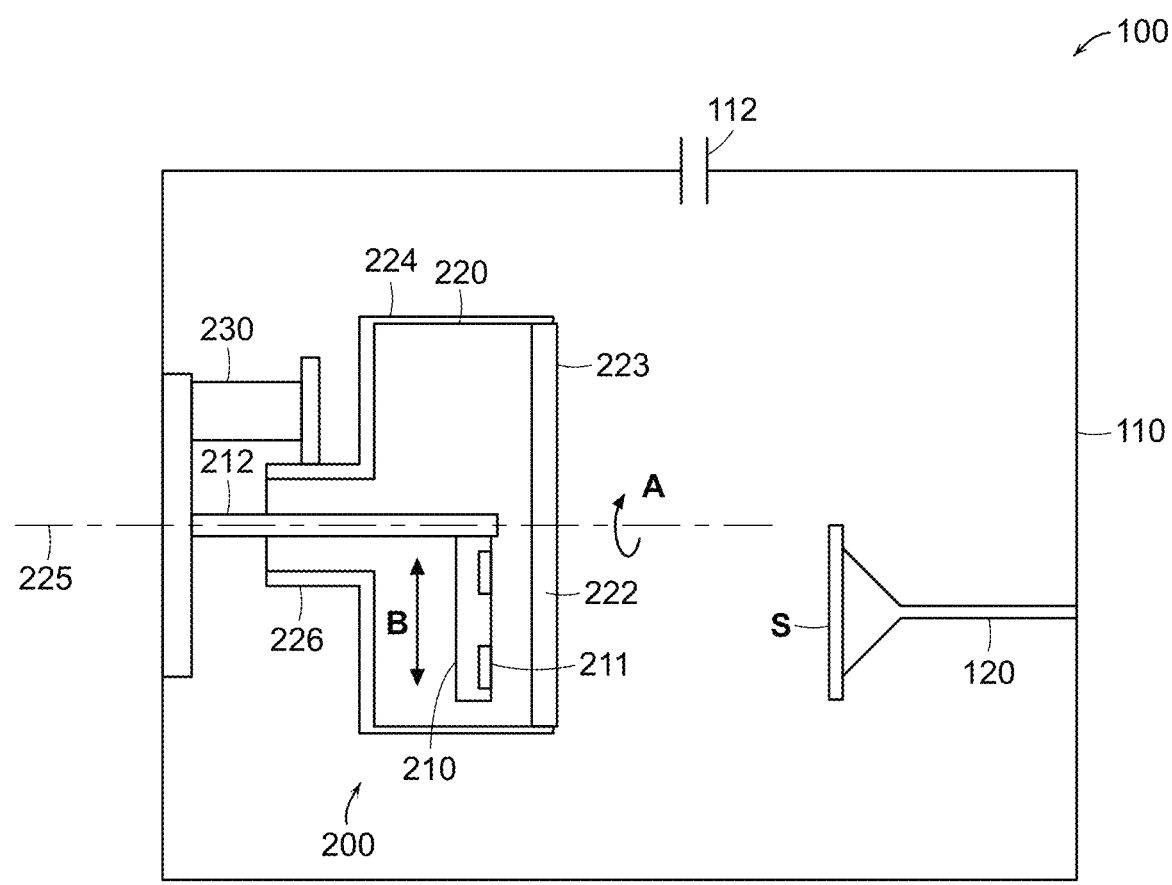
FIG. 4 is a schematic illustration of a sputtering system in accordance with other exemplary embodiments of the present disclosure.

According to certain exemplary embodiments of the invention, as shown in FIG. 4, magnet array 210 moves relative to target axis 225 of target 222. As a non-limiting example, magnet array 210 may oscillate radially (back and forth in the direction of arrow B) from target axis 225, in the plane of the magnetic array, using relative small displacements. This may serve to further smooth out any erosion pattern formed on erosion surface 223. As another example, magnet array 210 may move in the plane of the magnet array in an X- or Y-direction (or both an X- and Y-direction) relative to target axis 225.

Figure 6:
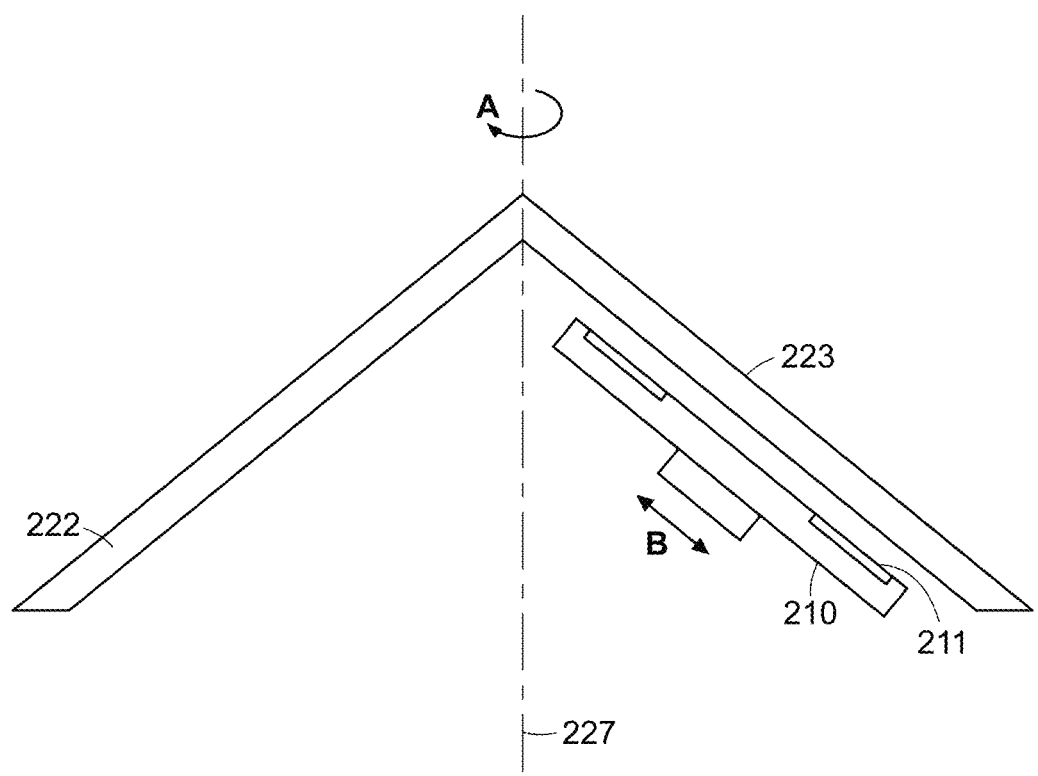
FIG. 6 is schematic illustration of an alternative embodiment of a target and magnetic array unit of the sputtering system of FIG. 1.

In another embodiment, as shown in FIG. 6, target 222 is conically-shaped. Magnetic field source 210 is located within the cone of target 222. In an exemplary embodiment, magnetic field source has a two-dimensional, curvilinear, array of magnets, i.e., the array of magnets essentially follows the curve of the cone. Conically-shaped target 222 may rotate around an axis 227 that extends through the center of the cone (see arrow A). Magnetic field source 210 may be stationary or may oscillate slightly parallel to the surface 223 of the cone (see arrow B).

Figure 6A:
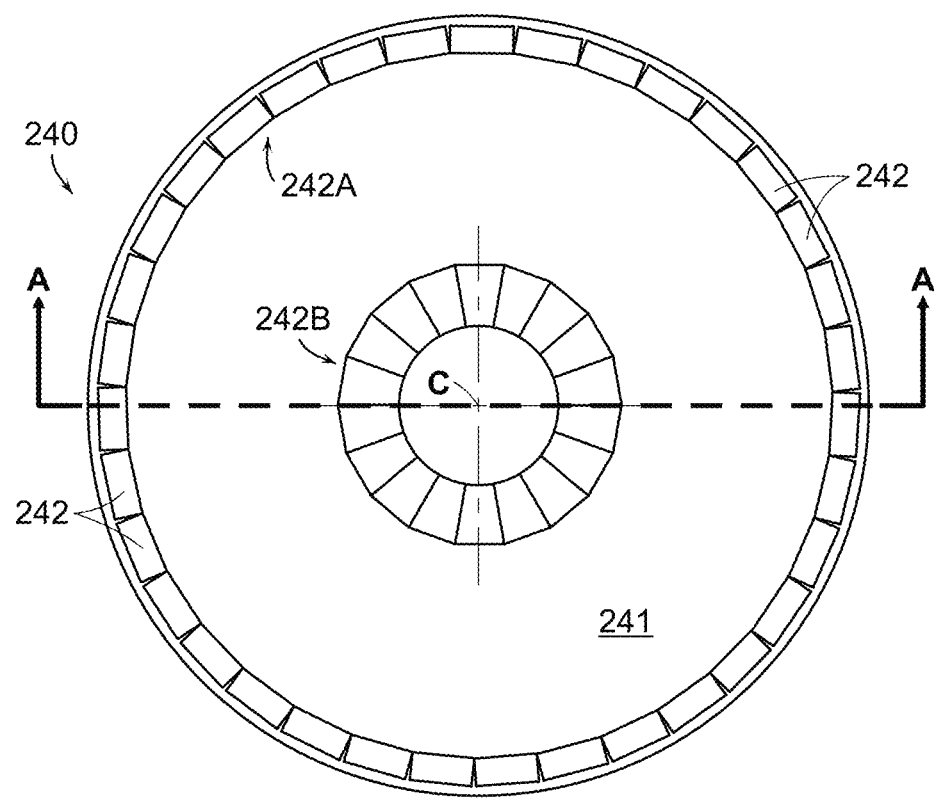
FIG. 6A is a plan view of a round or circular magnet array (that is, comprising magnets laid out in a round or circular pattern in a plane parallel to the planar sputtering surface of the target) suitable for at least certain exemplary embodiments of the cathode assemblies and sputtering systems disclosed here.
Figure 6B:
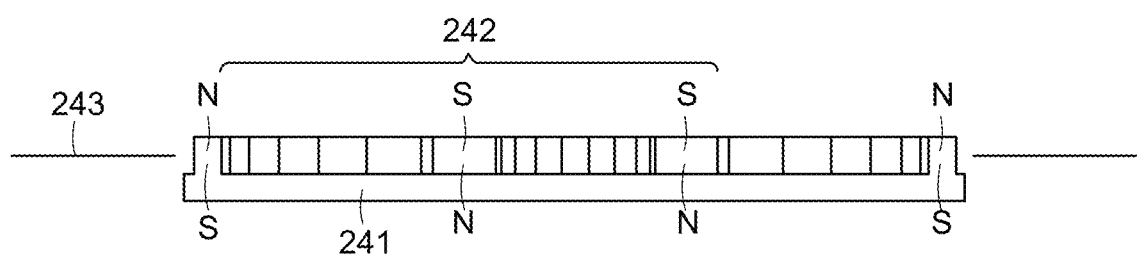
FIG. 6B is a sectional elevation taken through line A-A of FIG. 6A.

Referring now to FIGS. 6A and 6B, a round or circular magnet array is shown that is suitable for at least certain exemplary embodiments of the cathode assemblies and sputtering systems disclosed here. The magnet array 240 has magnets 242 laid out in a round or circular pattern in a plane, specifically, a plane 243 parallel to the planar sputtering surface of the target. The magnets include outer ring 242A and inner ring 242B. The magnets of both the inner and outer rings are centered about point "C" on a support plate 241.

Referring now to FIGS. 7A and 7B, a non-circular magnet array 244 is shown, specifically, an apple-shaped or cardioid shaped array that is suitable for at least certain exemplary embodiments of the cathode assemblies and sputtering systems disclosed here. The magnet array 244 has magnets 246 laid out in such cardioid pattern in a plane 247 parallel to the planar sputtering surface of the target. The magnets include outer (non-circular) ring 246A and inner (non-circular) ring 246B. The magnets are positioned on a support plate 248.

Figure 5:
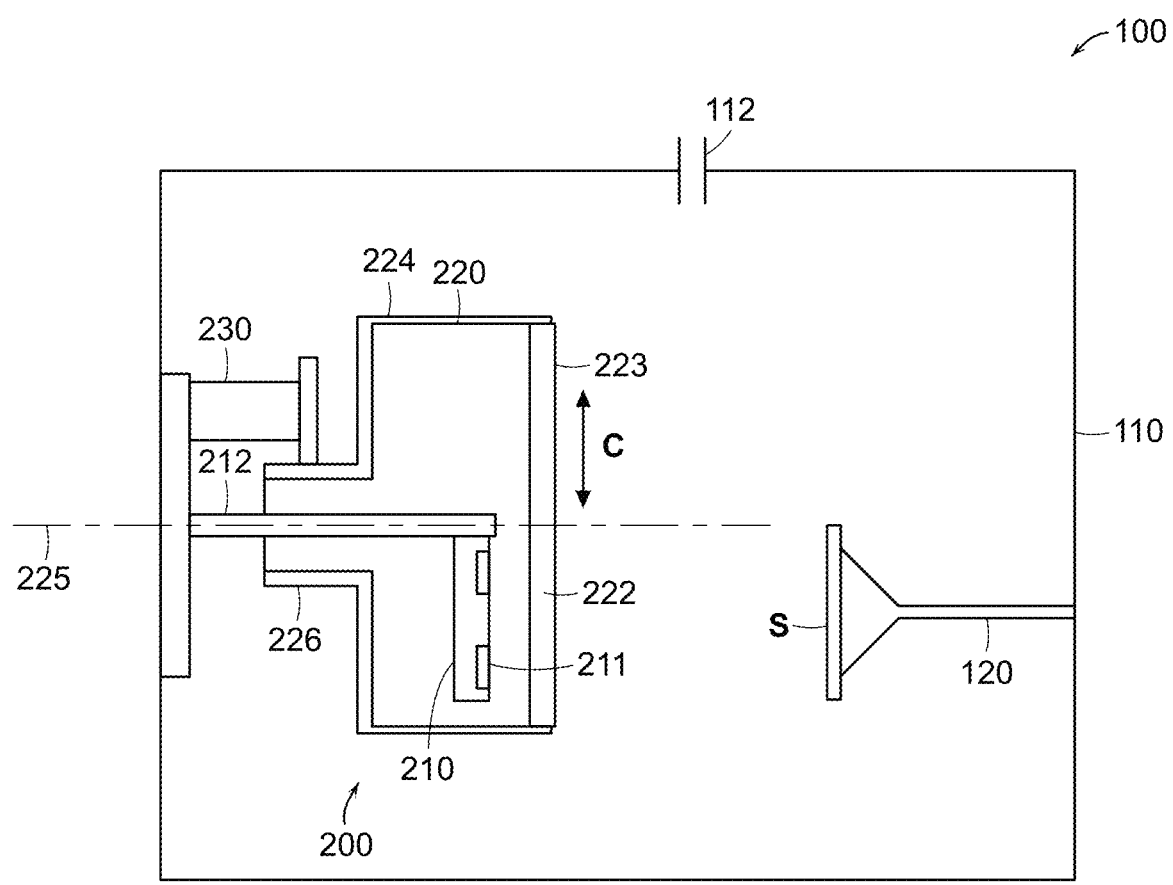
FIG. 5 is a schematic illustration of a sputtering system in accordance with even other exemplary embodiments of the present disclosure.

In yet other exemplary embodiments, as best shown in FIG. 5, target support 220 may move linearly, parallel to the plane of surface 223 (see arrow C). This may be particularly useful if the planar target is substantially rectangular or elongate. In such instance, the width dimension of target 222 may be substantially the same as the width dimension of magnetic array unit 210, while the length dimension of target 222 may be considerably longer than the length dimension of magnetic array unit 210. Thus, the rectangular or elongate target 222, may be slidably driven back-and-forth in its length direction over magnetic array unit 210 in order to develop a substantially uniform erosion profile while maintaining a stationary deposition plume. In other exemplary embodiments, target support 220 may move by a combination of movements within the plane. For example, target support 220 may move linearly in a first direction and also rotate round an axis perpendicular to the plane of top surface 223. Alternatively, target support 220 may move linearly in the plane of top surface 223 in two mutually orthogonal directions.

The sputtering processes disclosed here, according to an aspect of the invention, includes placing a cathode assembly 200 having a magnet array 210 and a target support 220 in a vacuum chamber 110. The target support 220 is connected to drive mechanism 230. The magnet array 210 includes a plurality of magnets arranged in a substantially planar two-dimensional array. Target support 220 includes a target 222 having a substantially planar erosion surface 223. A substrate, upon which material from the target is to be deposited, is placed in the vacuum chamber. A vacuum is drawn in the vacuum chamber and an inert sputtering gas, optionally a reactive sputtering gas, or a combination of inert and reactive sputtering gases are introduced into the chamber. An electrical potential is applied to the cathode assembly to initiate a plasma. Power is supplied to cathode assembly to drive the drive mechanism and thereby move target support 220 relative to the substantially planar two-dimensional array of the plurality of magnets of the magnet field source 210. Each of the cathode assemblies of the system may optionally be of substantially the same configuration as disclosed here, although various alternative cathode assembly configurations known to those skilled in the art may be used in addition or instead.

During sputtering, the ion density of the plasma formed will be higher in the area near magnetic array unit 210 as compared to the plasma in the area of the target remote from magnetic array unit 210. With an increased ion density, material is sputtered from the target at a higher rate. For certain applications requiring improved uniformity, the cathode assembly may be spaced a greater distance from the substrate (S), forming a "long-throw" deposition plume. The substrate may be spun about its axis to further improve uniformity. As an example of a long-throw sputtering process, cathode assembly 200 may be spaced from the substrate (S) by about 150 mm to about 500 mm in both dimensions of offset and displacement.

According to the exemplary embodiments disclosed herein, the area of the target's erosion surface can be made almost arbitrarily large. This reduces the amount of etch or erosion from each deposition cycle for any given area of the target surface. Further, large targets provide an increased inventory of target material. It is expected that the ratio of the area of the planar erosion surface of the target to the area of the footprint of the magnetic field source would typically be greater than approximately 3.0, and that the ratio could easily be greater than approximately 4.0 or 5.0.

Due to the improved erosion profile, it is expected that the utilization of the target could exceed 50% or even 60%. In certain instances, it is expected that utilization of the target in a commercially efficient sputtering operation could range from approximately 60% to approximately 85%.

Figure 8:
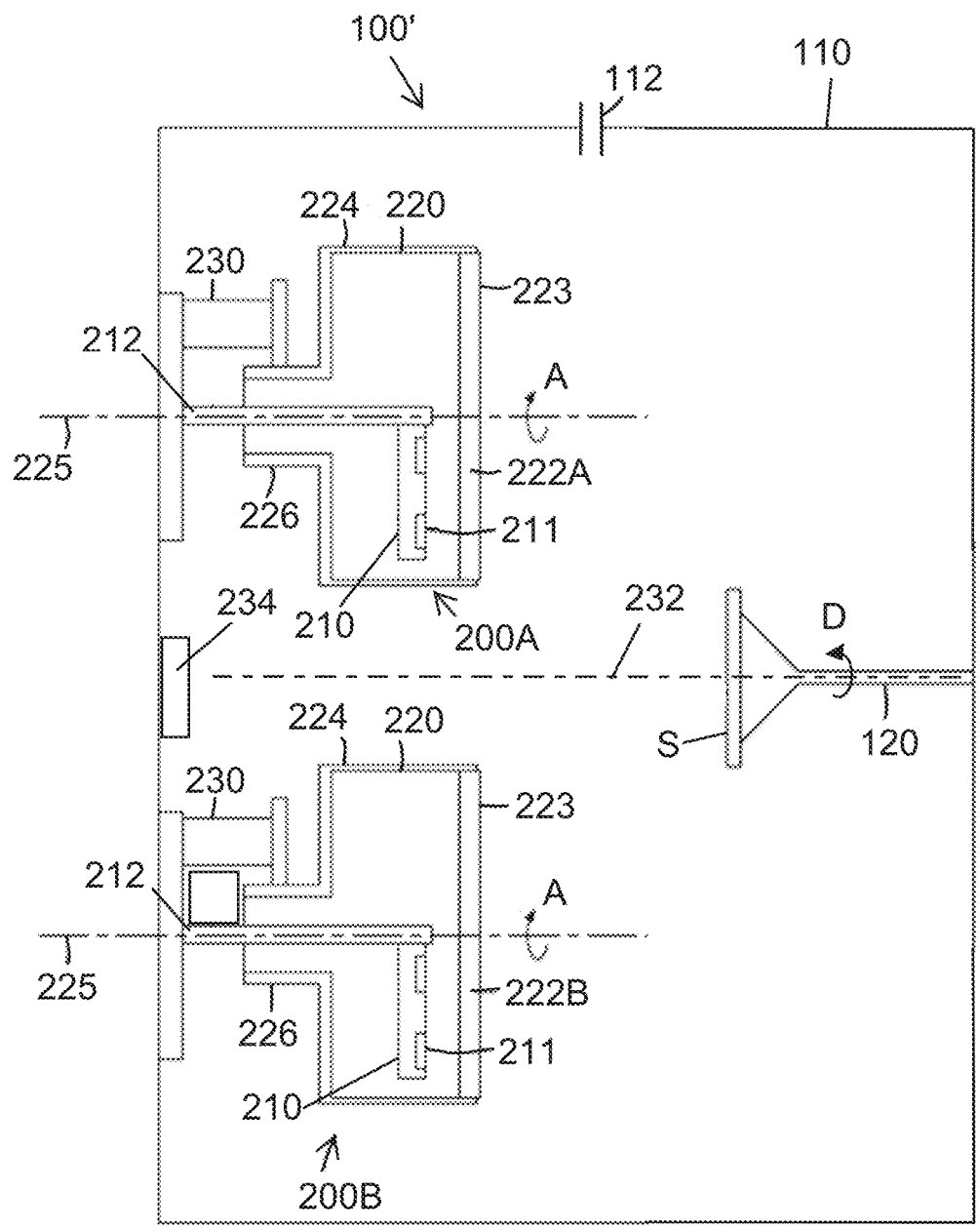
FIG. 8 is a schematic illustration of an alternative embodiment of a sputtering system with two cathode assemblies.
Figure 9:
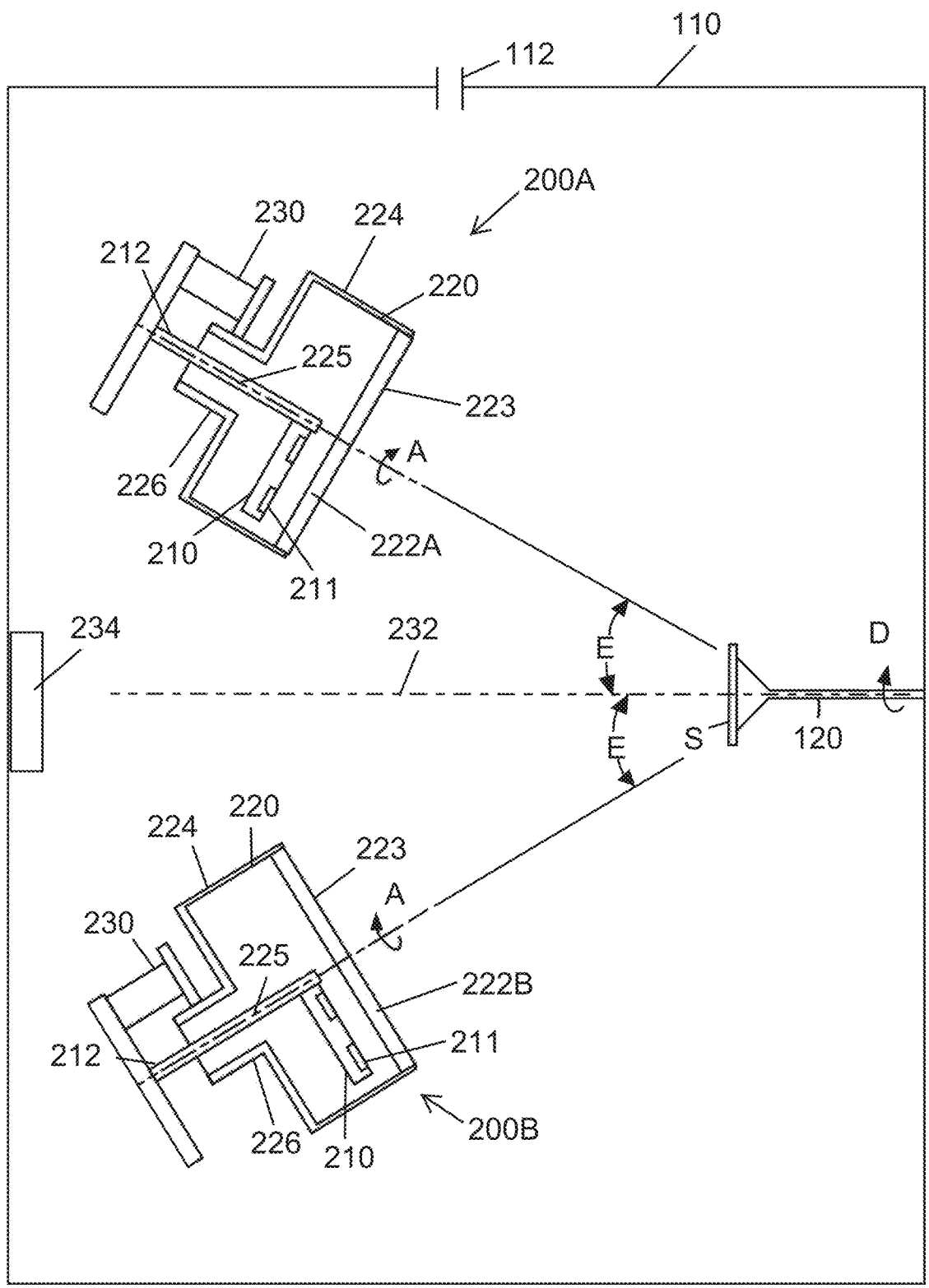
FIG. 9 is a schematic illustration of an alternative embodiment of a sputtering system with a plurality of assemblies having targets oriented at an angle with respect to central axis of a substrate.
Figure 10:
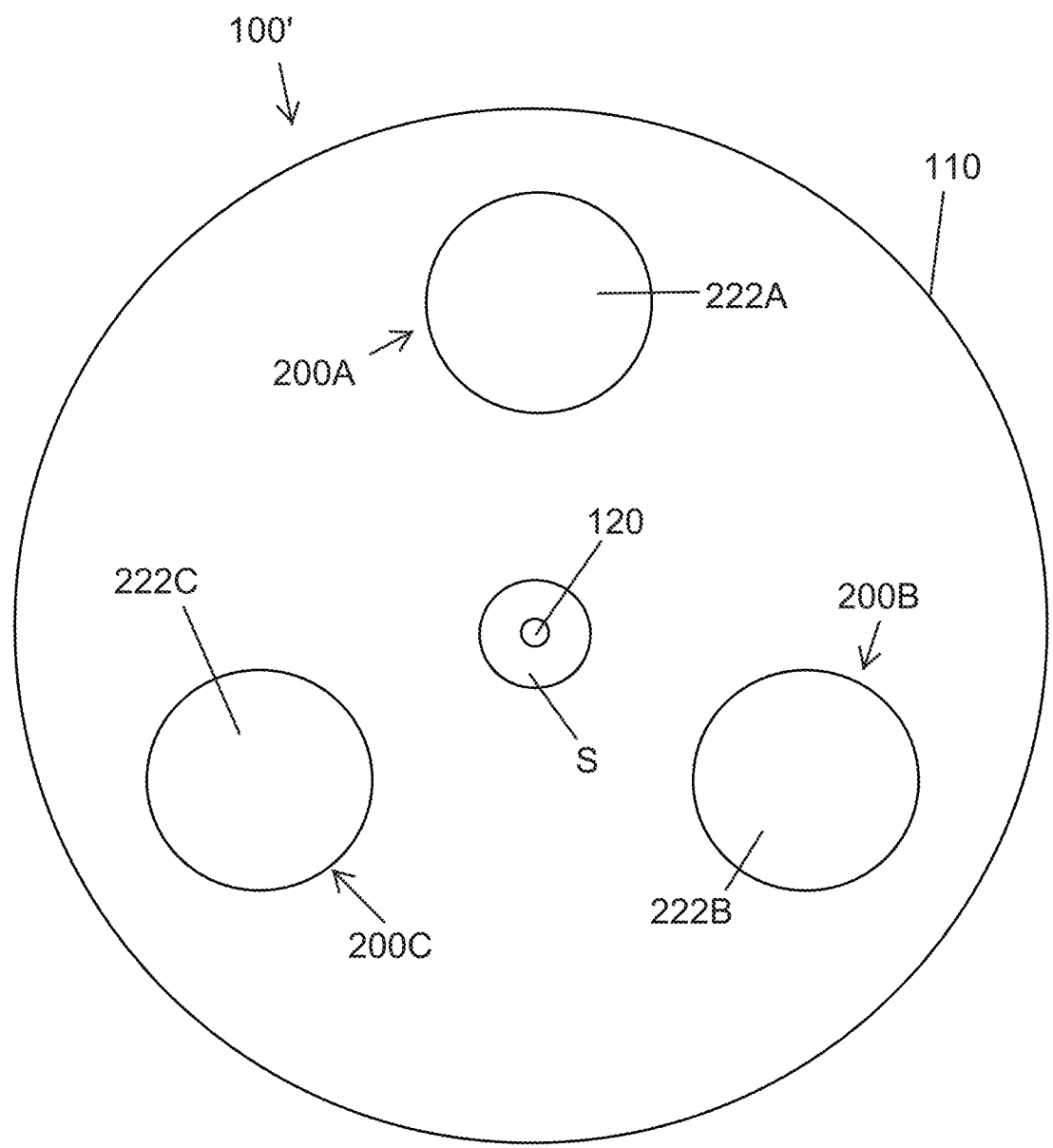
FIG. 10 is a schematic illustration of an alternative embodiment of a sputtering system with three cathode assemblies.

In the embodiment of a sputtering system 100 schematically shown in FIG. 1, a single cathode assembly is shown. It is to be understood that a sputtering system 100' including a plurality of cathode assemblies may be positioned within vacuum chamber 110, as seen in FIGS. 8-10. Further it should be understood that the cathode assembly disclosed herein may have utility in other sputtering system configurations, including those sputtering systems configured to process large area substrates.

In certain embodiments, cathode assembly 200 may be powered by a DC power supply, such as a Pinnacle Plus power supply available from Advanced Energy of Denver, Colorado.

As illustrated in FIGS. 8-10, a plurality of cathode assemblies 200 are positioned within vacuum chamber 110. In the embodiment illustrated in FIG. 8, two cathode assemblies 200A, 200B are positioned within vacuum chamber 110 along with a single substrate S rotatably mounted on workpiece holder 120. In certain embodiments, substrate S may be configured to rotate around a central axis 232, as shown by arrow D. In certain embodiments, central axis 232 may be substantially perpendicular to a planar surface of substrate S, and may be substantially parallel to target axes 225, about which targets 222A, 222B of cathode assemblies 200A, 200B, respectively, rotate.

It is to be appreciated that in embodiments where sputtering system 100' includes multiple cathode assemblies 200 that they may be powered by an AC power supply, such as a PEII Series power supply available from Advanced Energy of Denver, Colorado. An AC power supply does not require an anode, thereby eliminating the problem of coating build-up on the anode.

In certain embodiments, substrate S may be configured to rotate at a speed of between approximately 30 rpm and approximately 1500 rpm, and more typically between approximately 100 rpm and approximately 1000 rpm.

In certain embodiments it may be desirable to deposit alternating layers of different materials and/or different thicknesses on substrate S. In order to vary the type and/or thickness of the material layer deposited on substrate S, the cathode assemblies 200A, 200B may be configured such that one or more of the cathode assemblies 200A, 200B are operational at the same time that one or more other of the cathode assemblies 200A, 200B are idle. Thus, sets or subsets of the plurality of cathode assemblies 200A, 200B may be operated at different times.

It is also to be appreciated that the thickness of the layer of material deposited on substrate S may be controlled by varying the time that a cathode assembly 200 is operational, with longer operational times producing thicker layers of material. In certain embodiments, one or more cathode assemblies 200 may be operated to provide a calibration coating run in order to accurately measure the deposition rate on substrate S. A calibration coating run may be a single layer of material in certain embodiments. In other embodiments, the entire test coating design, i.e., multiple layers, being produced may be incorporated in the calibration coating run. It is to be appreciated that commercial thickness monitors, e.g., oscillating quartz crystal thickness monitors, may be used to measure the thickness of substrate S.

In certain embodiments, the thickness of the film layer deposited on substrate S can be, for example, between approximately 10 and approximately 200 nm and more typically between approximately 5 nm and approximately 10 microns. As noted above, different materials may be deposited by different cathode assemblies 200 simultaneously positioned within vacuum chamber 110. In certain embodiments, for example, one or more cathode assemblies 200 each may include a target 222 of, e.g., tantalum for sputtering to form tantalum layers on substrate S mounted in vacuum chamber 110, while one or more other cathode assemblies 200 each may include a target of, e.g., silicon ("Si"), which are sputtered in the presence of oxygen in the vacuum chamber, while the tantalum cathode assemblies are not being actuated, to form silicon oxide layers alternating with the tantalum layers on the surface of substrate S.

It is to be appreciated that any number of layers of different materials from various targets 222 may be deposited on substrate S. The materials of the targets 222 may also be combined with different reactive gasses. Thus, for example, target 222A could be used to deposit a first layer formed of Si on substrate S, after which oxygen may be added to vacuum chamber 110 and combined with target 222A to deposit a second layer formed of $SiO_2$ on substrate S, after which target 222B could be used to deposit a third layer of tantalum on substrate S. It is to be appreciated that after the second layer of $SiO_2$ is deposited on substrate S that vacuum chamber 110 would be pumped out to remove some or all of the oxygen that had been introduced.

It should be understood that various alternative embodiments in accordance with this disclosure may have more than two sets of cathode assemblies, each set having a different kind of target material. Each such set of cathode assemblies may comprise one or more cathode assemblies. Thus, magnetron sputtering systems as disclosed here optionally may have three, four of more sets of cathode assemblies mounted and operational for sputtering within the same vacuum chamber, wherein each set comprises one or more cathode assemblies having a target material different from the target material of the other sets of cathode assemblies.

In accordance with various alternative embodiments, some or all of the different cathode assemblies 200 may be controlled by a cathode assemblies controller assembly 234 operative to selectively actuate the different sets of cathode assemblies sequentially with one another. In certain embodiments cathode assemblies controller assembly 234 is operative to selectively actuate different sets of cathode assemblies wholly or partly simultaneously, e.g., with complete or partial overlap of their actuation time periods. The cathode assemblies controller assembly 234 optionally may be further operative to switch all or at least some of the cathode assemblies back and forth between different sets of cathode assemblies, i.e., from one set to another. Together with installing a different target material in a cathode assembly switched to a different set, this function of the controller can provide advantageous flexibility in achieving desired deposition rates for different materials to be sputtered and deposited onto the substrate.

Cathode assemblies controller assembly 234 may include any combination of hardware and/or software elements suitable to independently control the operation of each of the cathode assemblies 200. For example, cathode assemblies controller assembly 234 may comprise a mechanical relay with software configured to send a message to turn the relay on and off. It is to be appreciated that in certain embodiments, cathode assemblies controller assembly 234 may be operative to control the actuation of cathode assemblies 200 in response to a changing optical property of substrate S as a layer of substrate S is being deposited. In the illustrated embodiment, a single cathode assemblies controller assembly 234 is operably connected to both of cathode assemblies 200A, 200B to control their operation. It is to be appreciated that in other embodiments, a separate cathode assemblies controller assembly 234 could be provided on each cathode assembly 200 positioned within vacuum chamber 110. In order to vary the times at which cathode assemblies 200A, 200B operate, cathode assemblies controller assembly 234 may comprise a timer configured to control the operation of cathode assemblies 200A, 200B, actuation of which may be controlled in a simple on/off sequencing arrangement. The timer may be configured to alternately actuate cathode assemblies 200A, 200B on and off for a single specified time interval, for example, 30 seconds on and then 30 seconds off.

In certain embodiments, cathode assemblies controller assembly 234 may be configured to control operation of cathode assemblies 200 using a combination of time intervals and control based on an optical property of substrate S. For example, cathode assemblies controller 234 may be configured to use both a timer and a thickness monitor, e.g., a quartz crystal thickness monitor. In such an embodiment, actuation of cathode assemblies 200 may be controlled based on time intervals for a period of time, followed by control based on the thickness monitor. The thickness monitor may be configured to determine a thickness of a layer of material being deposited on substrate S, and cathode assemblies controller assembly 234 may be configured to actuate a specific cathode assembly 200, or specific combination of cathode assemblies 200, and keep that specific cathode assembly 200 or combination of cathode assemblies 200 operating until a specified thickness of material is deposited on substrate S.

In certain embodiments, cathode assemblies controller assemblies 234 may be configured to operate cathode assembly 200A and cathode assembly 200B simultaneously. In other embodiments, cathode assemblies controller assemblies 234 may be configured to operate cathode assembly 200A and cathode assembly 200B in alternating fashion. It is to be appreciated that when cathode assembly 200A and cathode assembly 200B operate in alternating fashion, they may each be operational for the same length of time, or different lengths of time.

In certain embodiments, as illustrated in FIG. 9, cathode assemblies 200A, 200B may be oriented at an angle with respect to central axis 232. As illustrated here, cathode assemblies 200A, 200B may be in a confocal orientation with each target axis 225 of cathode assembly 200A, 200B oriented at angle E with respect to central axis 232. In certain embodiments, angle E may be between approximately 20° and approximately 40°, and more particularly approximately 30°.

Another embodiment of sputtering system 100' with a plurality of cathode assemblies 200 is illustrated in FIG. 10. In this embodiment, three cathode assemblies 200A, 200B, 200C, with respective targets 222A, 222B, 222C may be positioned in vacuum chamber 110. In certain embodiments, cathode assemblies 200A, 200B, 200C may be oriented in a confocal arrangement as described above with respect to FIG. 8.

In such an embodiment with three cathode assemblies 200A, 200B, 200C, cathode assemblies controller assembly 234 may be configured to operate the cathode assemblies in different modes. For example, in certain embodiments, all three cathode assemblies 200A, 200B, 200C may be configured to operate at the same time and, therefore, they would all be turned on and turned off at the same time. In other embodiments, a first set of the three cathode assemblies 200A, 200B, 200C may be operational while a second set is non-operational. For example, the first set may include cathode assembly 200A, and the second set may include cathode assemblies 200B, 200C.

In such an embodiment cathode assembly 200A of the first set may be operational for a first period of time T1 while cathode assemblies 200B, 200C of the second set are idle. Cathode assemblies 200B, 200C of the second set may then be operational for a second period of time T2 while cathode assembly 200A of the first set is idle. The first set and second set may then be operated in an on/off fashion alternately for a desired length of time, or until a desired thickness of material is deposited on substrate S.

It is to be appreciated that in certain embodiments first period of time T1 may be equal to second period of time T2, while in other embodiments first period of time T1 may be shorter or longer than second period of time T2.

It is to be appreciated that the first set and the second set can be configured differently as sputtering system 100' is operated. For example, in certain embodiments, the first set could include cathode assembly 200B, and the second set could include cathode assemblies 200A, 200C. In other embodiments, the first set could include cathode assembly 200C, and the second set could include cathode assemblies 200A, 200B.

In further embodiments, sputtering system 100' could include three sets, with the first and second sets operating in alternating fashion, and the third set being non-operational, e.g., disabled or simply left idle during the deposition run. In such an embodiment, the three sets could have a fixed configuration during the entire time that material is deposited on substrate S. Thus, for example, the first set could include cathode assembly 200A, the second set could include cathode assembly 200B, and the third set could include cathode assembly 200C. In such an embodiment, cathode assembly 200A and 200B would alternate operation, with cathode assembly 200C being non-operational for the entire time that material is deposited on substrate S.

In embodiments with a plurality of cathode assemblies 200, it is to be appreciated that the cathode assemblies 200 that are grouped in different sets and are operational in alternating fashion could change during the time that material is deposited on substrate S. For example, initially cathode assemblies 200A and 200B could operate in alternating fashion for a selected period of time, while cathode assembly 200C is non-operational. Then, cathode assemblies 200A and 200C could operate in alternating fashion for another selected period of time, while cathode assembly 200B is non-operational. This could be followed by cathode assemblies 200B and 200C operating in alternating fashion for another selected period of time, while cathode assembly 200A is non-operational. It is to be appreciated that any combination of the three cathode assemblies 200A, 200B, 200C could be used in alternating operational and non-operational fashion to deposit material on the surface of substrate S.

Figure 11:
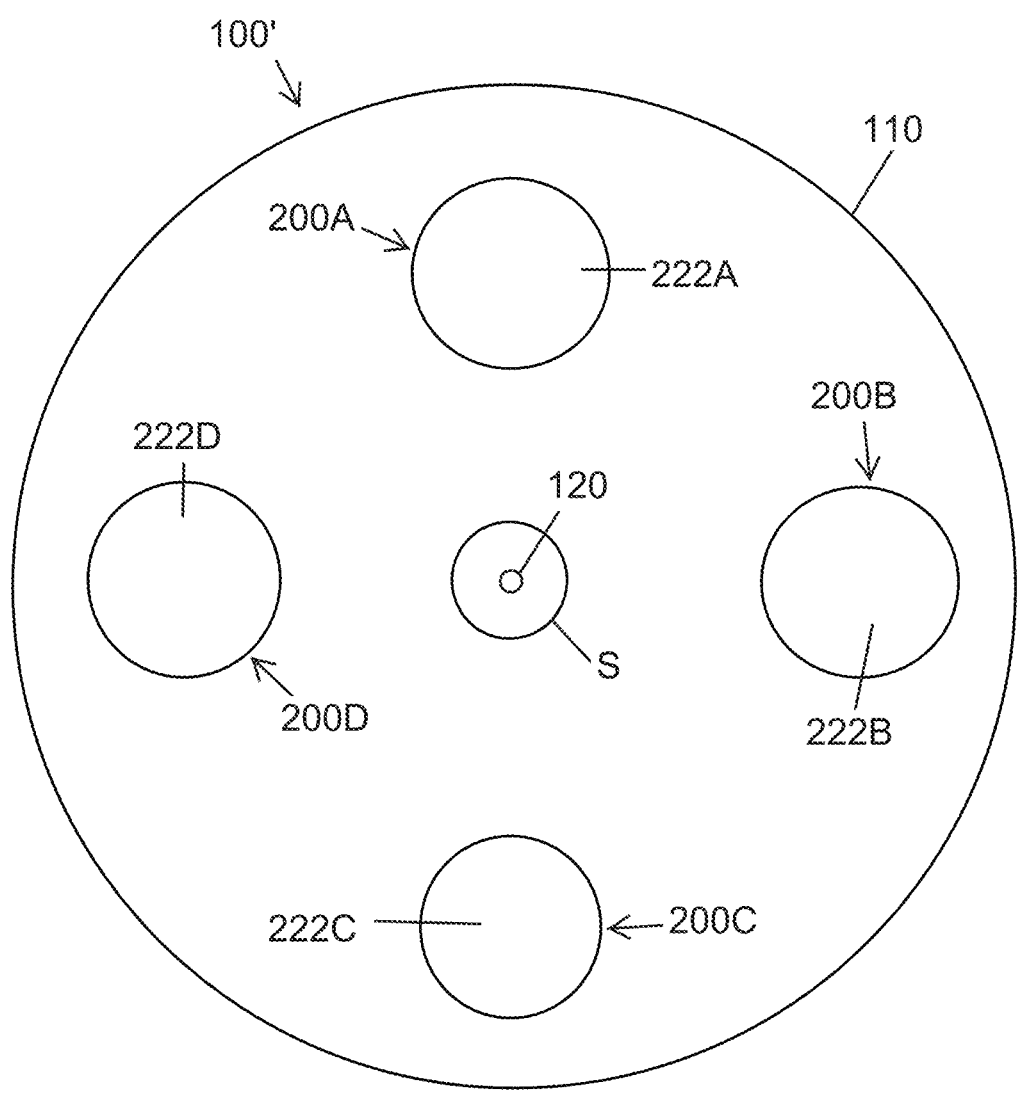
FIG. 11 is a schematic illustration of an alternative embodiment of a sputtering system with four cathode assemblies.

Another embodiment of a sputtering system 100' with a plurality of cathode assemblies 200 is illustrated in FIG. 11. In this embodiment, four cathode assemblies 200A, 200B, 200C, 200D, with respective targets 222A, 222B, 222C, 222D may be positioned in vacuum chamber 110. In certain embodiments, cathode assemblies 200A, 200B, 200C, 200D may be oriented in a confocal arrangement as described above with respect to FIG. 8.

In such an embodiment with four cathode assemblies 200A, 200B, 200C, 200D, cathode assemblies controller assemblies 234 may be configured to operate the cathode assemblies in different modes. For example, in certain embodiments, all four cathode assemblies 200A, 200B, 200C, 200D may be configured to operate at the same time and, therefore, they all would be turned on and turned off at the same time. In other embodiments, two or more sets of cathode assemblies 200A, 200B, 200C, 200D could be operational and/or non-operational at different times.

For example, two sets of cathode assemblies could be provided with the first set including cathode assemblies 200A, 200B, and the second set including cathode assemblies 200C, 200D. In such an embodiment, the first set may be operational for a first period of time T1 while the second set is idle. Then, the second set may be operational for a second period of time T2 while the first set is idle. The first set and second set may then be operated in an on/off fashion alternately for a desired length of time, or until a desired thickness of material is deposited on substrate S.

It is to be appreciated that in certain embodiments first period of time T1 may be equal to second period of time T2, while in other embodiments first period of time T1 may be shorter or longer than second period of time T2.

It is to be appreciated that the first set and the second set can be configured differently as sputtering system 100' is operated. For example, in certain embodiments, the first set could include cathode assemblies 200A, 200C, and the second set could include cathode assemblies 200B, 200D. In other embodiments, the first set could include cathode assemblies 200A, 200D, and the second set could include cathode assemblies 200B, 200C.

In other embodiments, a first set could include two cathode assemblies, a second set could include a single cathode assembly, and a third set could include a single cathode assembly. Thus, for example, the first set could include cathode assemblies 200A, 200B, while the second set could include cathode assembly 200C, and the third set could include cathode assembly 200D. In such an embodiment, the first set could be operational for a first period of time T1, while the second and third sets are non-operational. The second set could then be operated while the first and third sets are non-operational. Finally, the third set could then be operated while the first and second sets are non-operational.

It is to be appreciated that the plurality of cathode assemblies 200 in sputtering system 100' could include any number of cathode assemblies, and that the number of cathode assemblies can be greater than four. Additionally, it is to be appreciated that each set of cathode assemblies can include one or more cathode assemblies. Further, as discussed above, the configuration of the sets of the plurality of cathode assemblies could be changed during the process of depositing a layer of material on substrate S.

Figure 12:
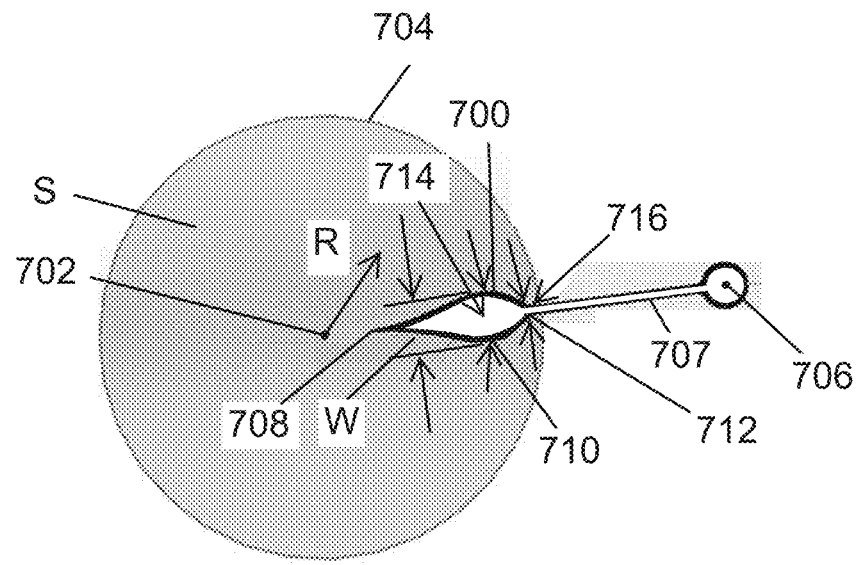
FIG. 12 is a plan view of an embodiment showing a pin mask disposed above a substrate.

In certain embodiments, as illustrated in FIG. 12, a first pin mask 700 may be positioned within vacuum chamber 110, and may be used during deposition to reduce film deposition thickness over a portion of the surface of substrate S. Importantly, the amount or degree of film thickness reduction varies in the radial direction of the substrate surface, i.e., in the direction from the center 702 of substrate S (i.e., the point coincident with its axis of rotation) toward its circumferential edge 704. Deposition using multiple rotary magnetron cathodes 200 as disclosed herein together with one or more pin masks 700 can achieve improved deposition thickness accuracy and uniformity. Use of first pin mask 700 during a deposition run can partially or entirely correct unwanted deposition thickness errors, especially unwanted film thickness variation in the radial direction of the coated surface of substrate S.

Deposition using multiple rotary magnetron cathodes 200 as disclosed here together with one or more pin masks 700 can achieve improved deposition thickness accuracy and uniformity. Consequently, optical filters can be produced meeting exacting performance specifications, and higher yields of in-spec optical filters can be achieved from a coated substrate S produced by a deposition run.

First pin mask 700 (referred to as such because in certain preferred embodiments it is generally pin or dagger shaped) may be elongate and generally planar. It is to be appreciated that first pin mask 700 may have a shape other than a pin or dagger shape. Typically, first pin mask 700 has a base 706 that may be rotationally or pivotally mounted to vacuum chamber 110 at a point radially spaced from circumferential edge 704 of substrate S. An arm 707 may connect first pin mask 700 to base 706. First pin mask 700 may lie in a plane parallel to the close plane of the substrate surface being coated, and typically may be spaced from the plane of substrate S, e.g., by about 0.2 to about 1.0 cm. First pin mask 700 may sit generally between the target 222 (not visible here) and substrate S. In the embodiment illustrated in FIG. 12, first pin mask 700 can be seen to extend longitudinally from base 706 toward centerpoint 702 of substrate S. Alternatively, in some embodiments the pin mask may be pivoted to a different orientation while still masking a portion of substrate S.

As mentioned above, the amount or degree of film thickness reduction caused by first pin mask 700 varies in radial direction R along the surface of substrate S. This is achieved by varying the lateral width W of first pin mask 700 along its longitudinal axis. That is, the lateral width W of first pin mask 700 differs along its axial length, generally widening and/or narrowing once or more times smoothly or continuously.

In the illustrated embodiment, lateral width W of first pin mask 700 has a first value at its distal end 708, which is positioned proximate centerpoint 702 of substrate S, and then widens to a second value at a central point 710, and from there it narrows to a third value at proximal end 712, where first pin mask 700 is connected to arm 707, with the third value being larger than the first, or minimum, value but smaller than the second, or maximum, value. The first value at distal end 708 is a point, the second value may be approximately 4% of the circumference of substrate S at that point, and the third value may be approximately 0.5% of the circumference of substrate S at that point. In such an embodiment, first pin mask 700 may have a substantially pear-shaped outline.

As can be seen in FIG. 12, central point 710 corresponds to, i.e., overlies (or underlies), a circumferential portion 714 of the surface of substrate S, being in a central portion of first pin mask 700 between centerpoint 702 of substrate S and the circumferential edge 704 of substrate S. Likewise, proximal end 712 of first pin mask 700 corresponds to, i.e., overlies (or underlies), circumferential portion 716 of the surface of substrate S, which is proximate circumferential edge 704 of substrate S. Since lateral width W of first pin mask 700 at circumferential portion 714 is greater than lateral width W of first pin mask 700 at circumferential portion 716, deposition thickness will be reduced a greater amount by the pin mask at circumferential portion 714 than at circumferential portion 716 of the surface of substrate S.

It is to be appreciated that lateral width W of first pin mask 700 at each point along its axial length overlapping the surface of substrate S being coated corresponds to the desired amount of film thickness reduction at that corresponding radial location of the surface of substrate S. The configuration of first pin mask 700 suitable for a particular deposition run or for deposition of a particular layer or set of layers (e.g., for some or all of a set of layers that alternate with other layers of a different material) on substrate S corresponds to the film thickness error correction desired. The lateral width W at each axial location along the length of first pin mask 700 generally is proportional to the thickness error at the corresponding radial location of the surface of substrate S.

The deposition thickness error to be corrected at each radial location along substrate S, and correspondingly a suitable configuration for a pin mask in accordance with this disclosure, including the lateral width at each point along the axial length of the pin mask, can be determined by any suitable means, including, e.g., by estimation or predictive calculation, or empirically based on measured radial deposition thickness variation on a substrate in a preliminary or test deposition run done without the benefit of a pin mask.

In certain exemplary embodiments, the layer thickness error is determined empirically by conducting a test run of all or a portion of a planned deposition run without first pin mask 700, and then measuring the optical thickness and/or other property or properties of the resulting coating at multiple radial locations along substrate S. The measured values determine the shape or profile of first pin mask 700 needed to correct the error. Optionally, the value of the measured property for each of several different radial distances from the centerpoint of the substrate can be taken as the average of the values measured at multiple locations spaced circumferentially at the same radial distance from centerpoint 702.

Average values can then be similarly determined for each of multiple additional radial distances from centerpoint 702 of substrate S. The difference between the desired property value and the measured property value corresponds to the thickness error. As noted above, the required lateral width W of first pin mask 700 at each point along its longitudinal axis is generally proportional to the thickness error at the corresponding radial location along substrate S. The wider first pin mask 700 is at a given axial location, the greater the reduction in deposition thickness at the corresponding radial location along substrate S. More specifically, the wider the pin mask at a particular axial location (corresponding to a radial location on the spinning substrate), the greater the reduction in deposition rate at that location. The total reduction in deposition thickness is determined by both the width of the pin mask and the time duration it is deployed during the deposition of the layer in question. The pin mask can be deployed for all or only a portion of the time during which a layer is being deposited, with correspondingly greater or less reduction in deposition thickness of the layer.

Thus, the pin mask lateral width at a particular axial location taken together with the portion of a layer's deposition time during which the mask is deployed to shadow the substrate together render the desired reduction in layer thickness at the corresponding axial location on the substrate.

Thus, collectively, the deposition variation or error values determined for multiple radial locations along substrate S determine the shape or profile of first pin mask 700. The deposition run may then be repeated with first pin mask 700 in place to correct the error determined by the test run results. For example, in certain exemplary embodiments, first pin mask 700 may be formed such that for each radial location along the surface of substrate S to be coated, the percentage of the surface of substrate S shadowed or occluded by first pin mask 700 is equal or approximately equal to (e.g., within 10% or within 5% of) the percentage coating thickness error determined by the test run for the optical coating, or for a particular layer of the coating at that radial location.

In certain exemplary embodiments, first pin mask 700 may be formed such that for each radial location along the surface of substrate S to be coated, the percentage of the surface of substrate S shadowed or occluded by first pin mask 700 is proportional or approximately proportional to the percentage coating thickness error determined for the optical coating or for a particular layer of the coating at that radial location. For example, if the percentage coating thickness error at a particular radial location is approximately 4%, the width W of first pin mask 700 at that point may be approximately 4% of circumference of substrate S at that radial location.

It will be understood that the rate of deposition of a material onto a substrate from a material source, e.g., from the target in magnetron sputtering, and therefore the degree of layer thickness error in the radial direction on the substrate may substantially change over the useful life of the source. Thus, in certain embodiments it will be advantageous to have the lateral width W of first pin mask 700 substantially wider than required for correction of the initially measured layer thickness error. The required total reduction in layer thickness can then be achieved by deploying the pin mask for less than the full time of the layer deposition. The amount or portion of a layer's deposition time that the mask is deployed can then be increased or decreased over the life of the source, corresponding to deposition rate changes as the source material is used, its surface configuration changes, and the resultant deposition rate changes. In this way the same pin mask can be used throughout the useful life of the source (or at least for deposition of multiple layers during its useful life) by adjusting the amount of time it is deployed during deposition of successive layer. Thus, for example, in a case where the percentage coating thickness error at a particular radial location is initially approximately 4%, the lateral width W of first pin mask 700 at that point may be approximately 8% of circumference of substrate S at that radial location, and first pin mask 700 could be in position to shadow or occlude substrate S for half the deposition time. For deposition of subsequent layers as the source is used and the deposition rate changes, first pin mask 700 could be deployed in position to shadow or occlude substrate S for correspondingly more or less than half the deposition time.

It is to be appreciated that the design of first pin mask 700 may be configured such that its lateral width W at any radial location corresponds to the instantaneous rate of deposition, relative to the average weight, at that particular radial location. It is also to be appreciated that the design of first pin mask 700 may take into consideration the location at which it will be deployed relative to the locations of the source/sources with respect to substrate S. For example, in a deposition chamber in which the source is not directly opposite the substrate being coated but rather is offset from the centerline (e.g., as in FIG. 9), the instantaneous deposition rate onto the spinning substrate typically is substantially different at different circumferential locations. While spinning the substrate substantially overcomes this effect, stationary deployment of the pin mask results in the degree of deposition rate adjustment being dependent on the location of its deployment. Thus, for example, in the embodiment illustrated in FIG. 9, cathode assemblies 200A, 200B are oriented at angle E with respect to substrate S. Thus, it will be understood from this disclosure that the configuration of the pin mask, the amount of time the pin mask is deployed during the deposition of a layer (i.e. the portion or percentage of the layer's deposition time), and the particular location of the pin mask yield the total net adjustment of deposition thickness.

Figure 13:
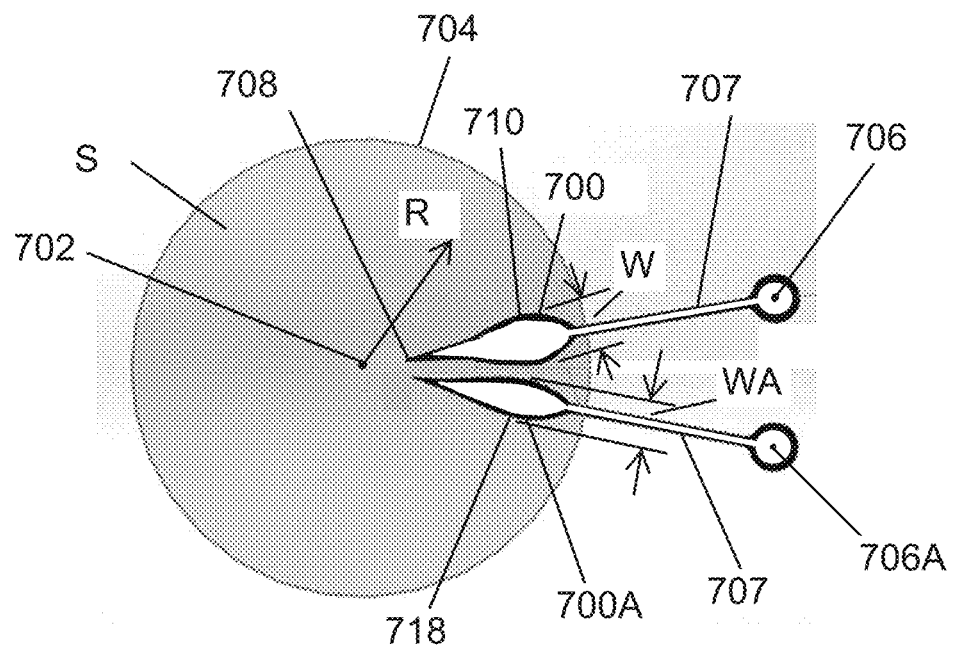
FIG. 13 is a plan view of an embodiment showing a pair of pin masks disposed above a substrate.

Another embodiment is shown in FIG. 13, in which a second pin mask 718 is rotationally mounted above substrate S with a base 706A and spaced circumferentially laterally from first pin mask 700 along substrate S. Second pin mask 718 optionally may have a lateral width WA that at some or all locations along its axial length is different than lateral width W of the corresponding location of first pin mask 700 and, therefore, will shadow or occlude a different percentage of substrate S during deposition of a layer on substrate S. In the illustrated embodiment, lateral width WA of second pin mask 718 is less than lateral width W of first pin mask 700 at corresponding points along the longitudinal axes of first pin mask 700 and second pin mask 718.

Thus, optionally first pin mask 700 and second pin mask 718 may be used for different layers of the deposited coating. First pin mask 700 may be used for some layers of the coating and not for others, e.g., first pin mask 700 may be used only for every other layer of an optical coating on substrate S, while second pin mask 718 can be used for the layers between the layers applied with first pin mask 700. It is to be appreciated that first pin mask 700 and second pin mask 718 can be used in any sequence, and, in certain embodiments, can be used simultaneously.

Figure 14:
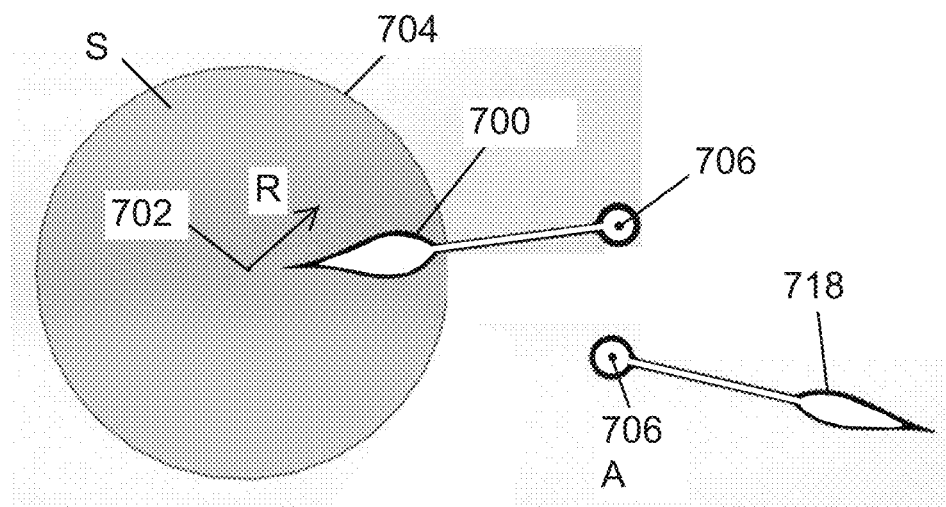
FIG. 14 is a plan view of an embodiments showing a first pin mask disposed above a substrate and a second pin mask pivoted such that it is not positioned above the substrate.

Thus, first and second pin mask 700, 718 can be used in alternating fashion to cover different percentages of substrate S to account for different error amounts. As illustrated in FIG. 14, when first pin mask 700 is in position over substrate S, second pin mask 718 may be pivoted about base 106A such that it is not positioned over substrate S, at which point a coating may be sputtered from one or more of the cathode assemblies onto substrate S to produce a particular layer. After that particular layer is deposited on substrate S with first pin mask 700, second pin mask 718 can be pivoted into position over substrate S, and first pin mask 700 may be pivoted away from substrate S (not shown), at which point a different layer may be deposited on substrate S.

Figure 15:
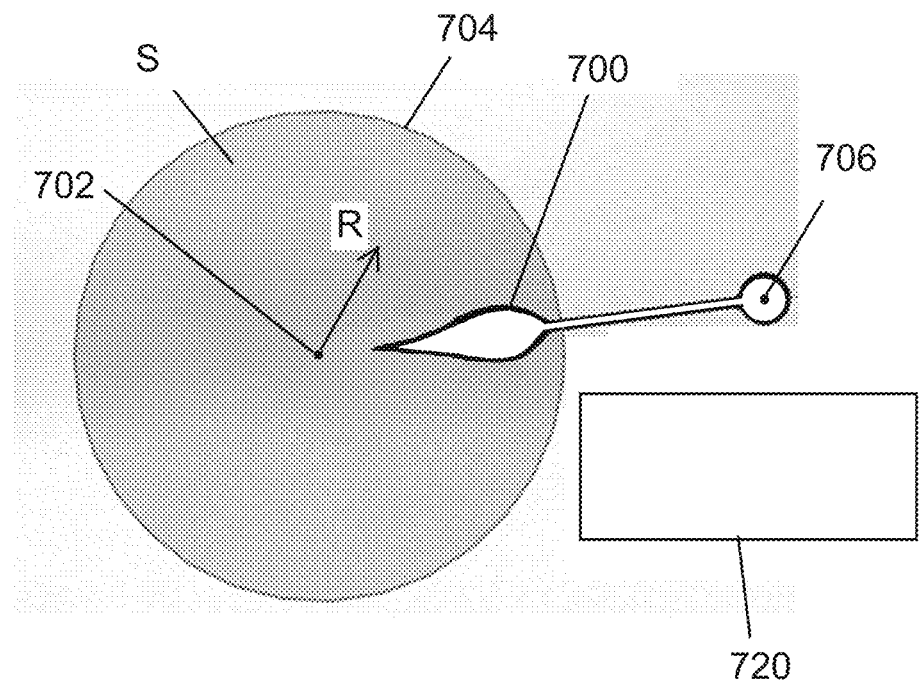
FIG. 15 is a plan view of an embodiment showing a pin mask that may be positioned behind a shutter when rotated away from a substrate.

Another embodiment is shown in FIG. 15, in which second pin mask 718 is positioned behind a shutter 720 when it is rotated away from substrate S, such that no sputterable materials is deposited on second pin mask 718 during a deposition process.

Those of ordinary skill in the art will recognize that the sputtering systems and cathode assemblies disclosed herein present significant technical and commercial advantages. The preceding detailed description of certain exemplary embodiments was not intended to limit the scope of the disclosure to merely those exemplary embodiments, but rather to be illustrative of such scope. Further, all examples, whether demarcated by the terms "for example," "such as," "including," "etc." or other itemizing terms, are meant to be non-limiting examples, unless otherwise stated or obvious from the context of the specification. Although the present invention has been described above in terms of certain exemplary embodiments, it should be understood that other embodiments, other uses, alterations and modifications thereof will be apparent to those skilled in the art given the benefit of this disclosure, and that such modifications can be made and other features added without departing from the principles disclosed here. Thus, it will be appreciated that various modifications and alterations will be apparent from this disclosure to those skilled in the art, without departing from the spirit and scope of the invention as set forth in the following claims. Also, it is intended that the embodiments described above be interchangeable, e.g. one or more elements of any of the embodiments may be interchanged with any of the elements of any other embodiments. It is also intended that the following claims be read as covering all such alterations and modifications as fall within the true spirit and scope of the invention. It should be understood that the use of a singular indefinite or definite article (e.g., "a," "an," "the," etc.) in this disclosure and in the following claims follows the traditional approach in patents of meaning "at least one" unless in a particular instance it is quite clear from context that the term is intended in that particular instance to mean specifically one and only one. Likewise, the term "comprising" is open ended, not excluding additional items, features, components, etc.

What is claimed is:

1. A magnetron sputtering system comprising, in combination:
   a vacuum chamber;
   a substrate mount for mounting a substrate within the vacuum chamber;
   a plurality of cathode assemblies including a first set of one or more cathode assemblies and a second set of one or more cathode assemblies, and configured for sputtering, each cathode assembly comprising:
      a target comprising sputterable material and having an at least partially exposed planar sputtering surface, the target of the first set of one or more cathode assemblies being formed of a first material and the target of the second set of one or more cathode assemblies being formed of a second material different than the first material;
      a target support configured to support the target in the vacuum chamber and rotate the target relative to the vacuum chamber about a target axis; and
      a magnetic field source including a magnet array mounted to be substantially stationary relative to the vacuum chamber during sputtering, the target being positioned between the magnet array and the substrate mount; and
   a cathode assemblies controller assembly operative to actuate the first set of cathode assemblies for sputtering the sputterable material of the first set of cathode assemblies without actuating the second set of cathode assemblies, and to actuate the second set of cathode assemblies for sputtering the sputterable material of the second set of cathode assemblies without actuating the first set of cathode assemblies.

2. The magnetron sputtering system of claim 1, further comprising a third set of one or more cathode assemblies, the target of the third set of one or more cathode assemblies being formed of a third material different than the first and second materials.

3. The magnetron sputtering system of claim 2, further comprising a fourth set of one or more cathode assemblies, the target of the fourth set of one or more cathode assemblies being formed of a third material different than the first, second, and third materials.

4. The magnetron sputtering system of claim 1, wherein the cathode assemblies controller assembly comprises a timer operable to actuate at least one set of cathode assemblies for sputtering for a period of time.

5. The magnetron sputtering system of claim 4, wherein the timer is operable to actuate the at least one set of cathode assemblies for sputtering for a predetermined period of time.

6. The magnetron sputtering system of claim 1, wherein the substrate is configured to rotate at a speed between approximately 300 rpm and approximately 500 rpm.

7. The magnetron sputtering system of claim 1, wherein the cathode assemblies are arranged in a confocal orientation about a central axis.

8. The magnetron sputtering system of claim 1, wherein the substrate is configured to rotate about a central axis, and each target axis is oriented with respect to the central axis at an angle of greater than 0 degrees and less than 90 degrees.

9. The magnetron sputtering system of claim 1, further comprising a first pin mask mounted in the vacuum chamber and configured to mask a portion of a substrate mounted on the substrate mount.

10. The magnetron sputtering system of claim 9, wherein a lateral width of the first pin mask has a first value at its distal end, a second value at a central point, and a third value at its proximal end, wherein the third value is larger than the first value and smaller than the second value.

11. The magnetron sputtering system of claim 9, wherein the first pin mask is connected by an arm to a base that is pivotally mounted to the vacuum chamber.

12. The magnetron sputtering system of claim 9, further comprising at least one additional pin mask.

13. The magnetron sputtering system of claim 9, further comprising at least one additional pin mask having a profile different than a profile of the first pin mask, and laterally spaced from the first pin mask.

14. A magnetron sputtering system comprising, in combination:
a vacuum chamber;
a substrate rotatably mounted about a central axis within the vacuum chamber;
a plurality of cathode assemblies arranged in a confocal orientation about the central axis, including a first set of cathode assemblies and a second set of cathode assemblies, and configured for reactive sputtering, each cathode assembly comprising:
a target comprising sputterable material having an at least partially exposed planar sputtering surface;
a target support configured to support the target in the vacuum chamber and rotate the target relative to the vacuum chamber about a target axis;
a magnetic field source including a magnet array mounted to be substantially stationary relative to the vacuum chamber during sputtering, the target being positioned between the magnet array and the substrate; and
a first pin mask mounted in the vacuum chamber and configured to mask a portion of the substrate;
wherein the plurality of cathode assemblies is configured such that when the first set of cathode assemblies is operational the second set of cathode assemblies is idle, and when the second set of cathode assemblies is operational the first set of cathode assemblies is idle.

15. The magnetron sputtering system of claim 14, wherein a lateral width of the first pin mask has a first value at its distal end, a second value at a central point, and a third value at its proximal end, wherein the third value is larger than the first value and smaller than the second value.

16. The magnetron sputtering system of claim 14, further comprising at least one additional pin mask.

17. The magnetron sputtering system of claim 14, further comprising a cathode assemblies controller comprising a timer operable to control operation of the first set of cathode assemblies and the second set of cathode assemblies.

18. The magnetron sputtering system of claim 14, wherein the substrate is configured to rotate at a speed between approximately 300 rpm and approximately 500 rpm.

19. The magnetron sputtering system of claim 14, wherein each target axis is oriented with respect to the central axis at an angle of greater than 0 degrees and less than 90 degrees.

20. A magnetron sputtering system comprising, in combination:
a vacuum chamber;
a substrate rotatably mounted about a central axis within the vacuum chamber and configured to rotate at a speed of between approximately 300 rpm and approximately 500 rpm;
a plurality of cathode assemblies arranged in a confocal orientation about the central axis, including a first set of two cathode assemblies and a second set of two cathode assemblies, and configured for reactive sputtering, each cathode assembly comprising:
a target comprising sputterable material having an at least partially exposed planar sputtering surface, the target of the first set of cathode assemblies being formed of a first material and the target of the second set of cathode assemblies being formed of a second material different than the first material,
a target support configured to support the target in the vacuum chamber and rotate the target relative to the vacuum chamber about a target axis, each target axis being oriented with respect to the central axis at an angle of greater than 0 degrees and less than 90 degrees; and
a magnetic field source including a magnet array mounted to be substantially stationary relative to the vacuum chamber during sputtering, the target being positioned between the magnet array and the substrate;
a pin mask mounted in the vacuum chamber and configured to mask a portion of the substrate; and
a timer to control operation of the first set of cathode assemblies and the second set of cathode assemblies such that when the first set of cathode assemblies is operational the second set of cathode assemblies is idle, and when the second set of cathode assemblies is operational the first set of cathode assemblies is idle.

* * * * *